(12) United States Patent
Aitken et al.

(10) Patent No.: US 10,347,782 B2
(45) Date of Patent: Jul. 9, 2019

(54) PHOTOVOLTAIC MODULE PACKAGE

(75) Inventors: Bruce Gardiner Aitken, Corning, NY (US); Mark Francis Krol, Painted Post, NY (US); James Ernest Webb, Corning, NY (US)

(73) Assignee: Corning Incorporated, Corning, NY (US)

( * ) Notice: Subject to any disclaimer, the term of this patent is extended or adjusted under 35 U.S.C. 154(b) by 472 days.

(21) Appl. No.: 14/236,824

(22) PCT Filed: Aug. 6, 2012

(86) PCT No.: PCT/US2012/049718
§ 371 (c)(1),
(2), (4) Date: Feb. 3, 2014

(87) PCT Pub. No.: WO2013/020128
PCT Pub. Date: Feb. 7, 2013

(65) Prior Publication Data
US 2014/0158201 A1  Jun. 12, 2014

Related U.S. Application Data

(60) Provisional application No. 61/515,042, filed on Aug. 4, 2011, provisional application No. 61/565,050, filed on Nov. 30, 2011.

(51) Int. Cl.
*B32B 17/10* (2006.01)
*C03C 3/062* (2006.01)
(Continued)

(52) U.S. Cl.
CPC .... *H01L 31/0488* (2013.01); *B32B 17/10036* (2013.01); *B32B 17/10119* (2013.01);
(Continued)

(58) Field of Classification Search
CPC ....... H01L 31/022425; H01L 31/02366; H01L 31/036; H01L 31/048; H01L 31/18;
(Continued)

(56) References Cited

U.S. PATENT DOCUMENTS 4,705,911 A  11/1987  Nakano et al. .............. 136/251
6,187,448 B1 *  2/2001  Hanoka .................. B32B 17/10
                                                        428/515
(Continued)

FOREIGN PATENT DOCUMENTS

CN          101348323           1/2009
EP           1118593           7/2001
(Continued)

OTHER PUBLICATIONS

The State Intellectual Property Office of the People's Rupublic of China; Search Report; dated Dec. 3, 2014; pp. 1-2.
(Continued)

*Primary Examiner* — Mayla Gonzalez Ramos
(74) *Attorney, Agent, or Firm* — Svetlana Z. Short

(57) ABSTRACT

A silicon wafer-based photovoltaic module is described, which includes a first outer protective layer and a second outer protective layer, wherein both outer protective layers comprise a low- or no-sodium glass or low- or no-alkali compositions. The photovoltaic modules show resistance to water ingress, no or reduced potential-induced sodium ion drift, and reduced potential induced degradation.

26 Claims, 10 Drawing Sheets

(51) Int. Cl.
*C03C 3/091* (2006.01)
*H01L 31/048* (2014.01)
*C03C 3/064* (2006.01)
*C03C 3/085* (2006.01)
*C03C 3/087* (2006.01)
*H01L 31/02* (2006.01)

(52) U.S. Cl.
CPC ........ *B32B 17/10761* (2013.01); *C03C 3/062* (2013.01); *C03C 3/064* (2013.01); *C03C 3/085* (2013.01); *C03C 3/087* (2013.01); *C03C 3/091* (2013.01); *H01L 31/02008* (2013.01); *Y02E 10/50* (2013.01)

(58) Field of Classification Search
CPC ... H01L 31/0488; H01L 31/049; Y02E 10/50; Y02E 10/52; Y02E 10/545; Y02E 10/546; Y02E 10/547
See application file for complete search history.

(56) References Cited

U.S. PATENT DOCUMENTS

| | | | |
|---|---|---|---|
| 6,852,658 B2 | 2/2005 | Peuchert et al. | 501/67 |
| 7,157,392 B2 | 1/2007 | Peuchert et al. | 501/66 |
| 7,201,965 B2 | 4/2007 | Gulati et al. | 428/426 |
| 7,612,004 B2 | 11/2009 | Aitken et al. | 501/64 |
| 7,615,506 B2 | 11/2009 | Aitken et al. | 501/44 |
| RE41,127 E | 2/2010 | Kohli | 428/428 |
| 7,727,916 B2 | 6/2010 | Peuchert et al. | 501/66 |
| 8,420,218 B2 | 4/2013 | Nattermann et al. | 428/426 |
| 8,850,111 B2 | 9/2014 | Hwang et al. | |
| 2003/0010378 A1 | 1/2003 | Yoda et al. | |
| 2005/0101469 A1* | 5/2005 | Peuchert | C03C 3/091 501/66 |
| 2007/0166947 A1 | 7/2007 | Gadkaree et al. | 438/404 |
| 2009/0014055 A1 | 1/2009 | Beck et al. | 136/246 |
| 2009/0121333 A1 | 5/2009 | Aitken et al. | 257/678 |
| 2009/0203283 A1 | 8/2009 | Gentile | 445/25 |
| 2009/0275462 A1* | 11/2009 | Murata | C03C 3/091 501/66 |
| 2009/0297861 A1 | 12/2009 | Banks et al. | |
| 2009/0297862 A1 | 12/2009 | Boek et al. | |
| 2010/0084016 A1* | 4/2010 | Aitken | C03C 3/091 136/258 |
| 2010/0129666 A1 | 5/2010 | Logunov et al. | 428/426 |
| 2010/0258183 A1 | 10/2010 | Natterrnann et al. | 136/256 |
| 2010/0300536 A1 | 12/2010 | Aitken et al. | 136/260 |
| 2011/0014475 A1* | 1/2011 | Murata | C03B 17/064 428/410 |
| 2011/0014731 A1 | 1/2011 | Nguyen et al. | 438/26 |
| 2011/0094781 A1 | 4/2011 | Ohmi et al. | 174/258 |
| 2011/0303259 A1* | 12/2011 | Fechner | C03C 3/085 136/243 |
| 2012/0111406 A1* | 5/2012 | Sawada | C03C 17/2456 136/256 |
| 2012/0125438 A1 | 5/2012 | Shimizu | |
| 2012/0202030 A1 | 8/2012 | Kondo et al. | 428/215 |
| 2012/0325293 A1* | 12/2012 | Nattermann | B32B 17/10788 136/251 |
| 2013/0104980 A1* | 5/2013 | Sridharan | B81C 1/00317 136/259 |

FOREIGN PATENT DOCUMENTS

| | | | |
|---|---|---|---|
| EP | 2119681 | 11/2009 | |
| EP | 2192621 | 6/2010 | |
| EP | 2239784 | 10/2010 | |
| EP | 2256826 | 12/2010 | |
| JP | 2005327886 A | 11/2005 | |
| JP | 2008022542 A | 1/2008 | |
| JP | 2008280189 A | 11/2008 | |
| JP | WO 2011010685 A1 * | 1/2011 | ......... C03C 17/2456 |
| JP | 5399106 | 11/2013 | |
| WO | 2011048978 | 4/2011 | |

OTHER PUBLICATIONS

IEC Norm: International standard IEC61215 (second edition 2005); Crystalline silicon terrestrial photovoltaic (PV) modules Design qualification and type approval; Internet Citation; Apr. 1, 2005.
Pern et al.; "Photothermal Stability of Encapsulated Silicon Solar cells and Encapsulation Materials Upon Accelerated Exposures"; Engineering and Reliability Division, National Center for Photovoltaics (NCPV); 2000; pp. 1491-1494.
European Patent Office; International Search Report; dated Jan. 23, 2013; pp. 1-6.
Jordan et al; "Outdoor PV Degradation Comparison"; Proc of IEEE 35th Photovoltaic Specialists Conference, Honolulu, Jun. 20-25, 2010.
PCT/US2012/048226 Search Report dated Nov. 16, 2012.
PCT/US2012/049718 International Preliminary Report on Patentability dated Feb. 13, 2014.
Pethe et al; "Statistical data analysis of thin film photovoltaic modules deployed in hot and humid climate of Florida"; Proc. of SPIE vol. 7048, 7048T-3 (2008).
Quintana et al; "Commonly observed degradation in field-aged photoboltaic modules"; Proc of IEEE 29th Photovoltaic Specialists Conference, New Orleans, May 5, 2002.
English Translation of JP2014524153 dated Jul. 12, 2016; 2 Pages; Japanese Patent Office.
TW101128313 Search Report dated Aug. 1, 2016, Taiwan Patent Office, 1 Page.
English Translation of JP2017137894 Office Action dated Jun. 12, 2018, Japan Patent Office, 6 pgs.

* cited by examiner

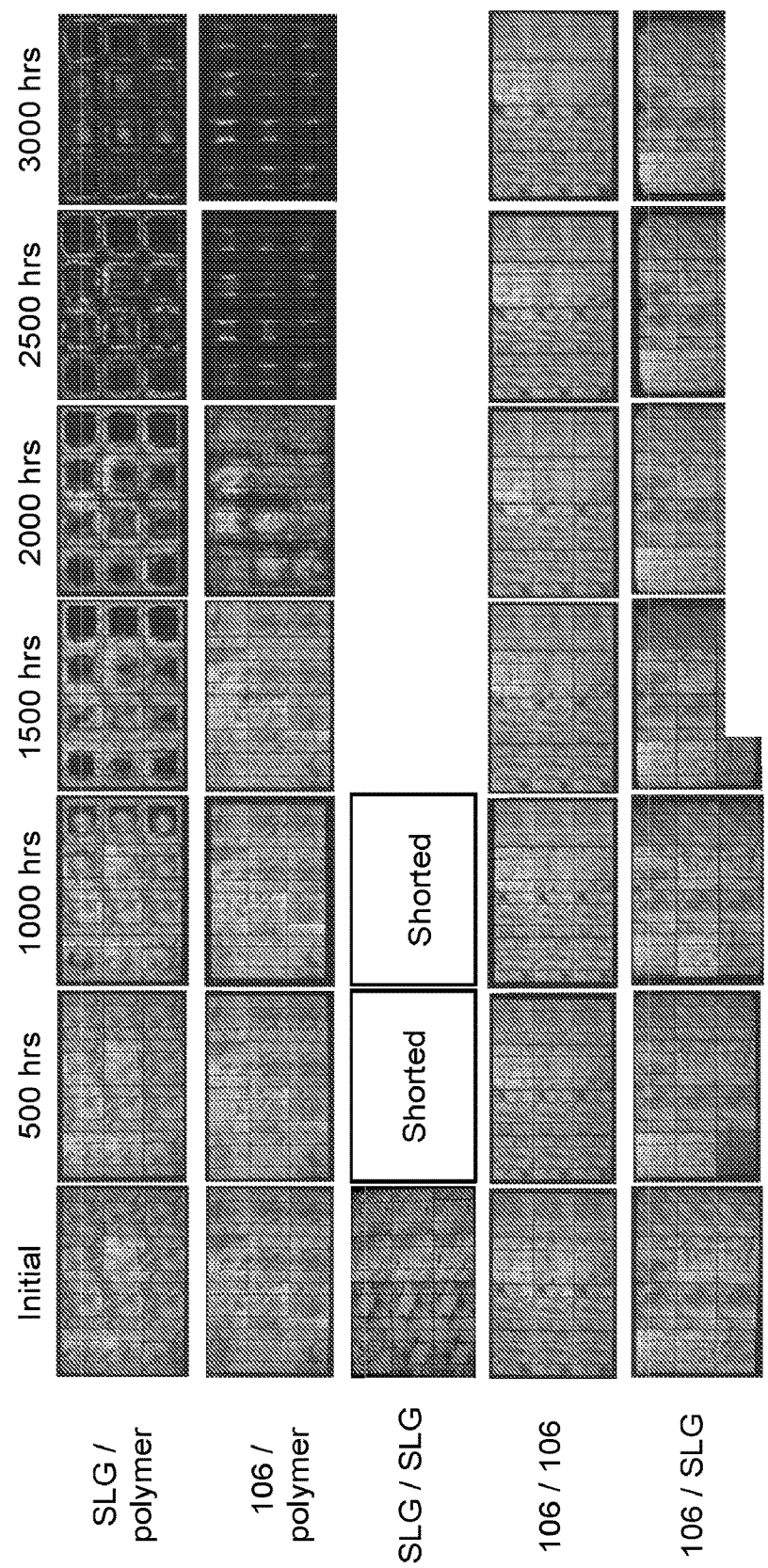

PHOTOVOLTAIC MODULE PACKAGE

This application claims the benefit of priority under 35 U.S.C. § 119 of the U.S. Provisional Application Ser. No. 61/515,042 filed on Aug. 4, 2011 and U.S. Provisional Application Ser. No. 61/565,050 filed on Nov. 30, 2011 the content of which is relied upon and incorporated herein by reference in its entirety.

BACKGROUND

Field

Embodiments relate to photovoltaic (PV) modules and photovoltaic module manufacturing processes.

Technical Background

Photovoltaic modules are used to convert sunlight into electricity. Two major types used or in development today are wafered modules using multiple silicon wafers ("wafered modules" or "wafered silicon modules" or "wafered silicon devices"—all terms that can be used interchangably) connected together and thin film modules using cadmium telluride (CdTe), copper indium gallium di-selenide (CIGS) or thin film (amorphous and microcrystalline) silicon. Typical packages 100 for the wafered modules have one protective glass layer 10 such as a soda lime glass, a polymer back sheet 12, silicon wafers 16 and encapsulant layers 20 between the protective glass layer and the back sheet, and optionally, an edge seal 18, a metal frame 14, and electrical contacts 22 as shown by the cross section in FIG. 1A. Typical packages 101 for thin film modules have two protective glass layers 10 such as soda lime, a thin film(s) 17, an encapsulant layer 20 between the two glass sheets, an edge seal 18, and electrical contacts 22 as shown by the cross section in FIG. 1B. Ethylene vinyl acetate (EVA), polyvinyl butyral (PVB) or other encapsulants are commonly used to bond the two sheets together. Sealing materials such as a butyl sealant at the module perimeters are used to increase moisture resistance.

There is a continuing drive to make PV technology competitive with existing power production methods, e.g., hydro, coal, nuclear, wind, etc., in the power generation industry. To do so, manufacturing costs, conversion efficiency, and efficiency degradation are some of the design challenges that need to be addressed.

BRIEF SUMMARY

It is desirable to have high initial conversion efficiencies and low degradation rates over the module life to increase the amount of electricity produced and decrease the levelized cost of electricity (LCOE) or $/kilowatt hour produced. FIG. 2 illustrates the improvements in these two areas. Improvement of initial module efficiencies shown by line 24 can be generated by improvement of cell performance. Other ways of improving the initial module performance include maximizing the cell aperture for a given module size. The edge delete regions and the area consumed by the scribes to create the cell to cell circuits use area in thin film modules that could otherwise be used to generate electricity. The edge delete region can be primarily used for the moisture barrier such that it makes direct contact with the glass on both sides. The width of the edge delete region can be essentially determined by the path length necessary to obtain satisfactory moisture resistance performance. Moisture barrier choice may be a factor affecting the width of the edge delete region as well as the degradation over life shown by line 26.

Wafered and thin-film photovoltaic modules both exhibit a continuous degradation in performance over their lifetimes, with thin-film modules degrading more quickly. This degradation can be linked to a multitude of issues, including ion migration, water ingress, and photodegradation of the device materials. Additionally, electrical potential (voltage) can be an acceleration mechanism for this degradation. FIG. 3 is a graph illustrating the effect of 1% and 2% annual degradation rates for wafered and thin-film modules, shown by lines 28 and 30, respectively. At the end of a 30 year lifetime, this results in performance degradations of 26% for wafered modules and 45% for thin-film modules.

The disclosed embodiments increase the energy output over the module's lifetime. Ideally, there would be no degradation, with the area above the curve shown in FIG. 3, being this opportunity. The potential is to increase the energy output over life by about 15% or more for wafered modules. This increases to about 30% when increasing the expected panel lifetime to 50 years, which has been mentioned as a goal for the industry. If degradation rates are higher, there is increased opportunity to further improve LCOE. Some reasons for the degradation rates described above are linked to inherent cell degradation and acceleration due to the presence of environmental moisture, moisture contained by materials, and the mobility of ions in the glass. For example, sodium from the glass can be mobile in photovoltaic devices, even reaching, for example, the back side of silicon wafers.

According to one aspect of the disclosure, a photovoltaic module utilizes low sodium or substantially sodium-free or low-alkali or substantially alkali-free specialty glass for wafered Si devices. According to another aspect of the disclosure, a wafered module consists of two sheets of low sodium or sodium-free or low-alkali or substantially alkali free specialty glass.

According to another aspect of the disclosure, a photovoltaic module comprises a first outer protective layer comprising a glass sheet; a second outer protective layer comprising a glass sheet; and at least one crystalline silicon solar cell wafer between the first and second outer protective layers; wherein the composition of the glass sheets comprises:

| Component | Range (approx. wt %) |
|---|---|
| $SiO_2$ | 0-70 |
| $Al_2O_3$ | 0-35 |
| $B_2O_3$ | 0-30 |
| MgO | 0-12 |
| CaO | 0-67 |
| SrO | 0-20 |
| BaO | 0-33 |
| RO | 0-68 |
| $Na_2O$ | 0-1 |
| $K_2O$ | 0-5 |
| $M_2O$ | 0-5 |

In another aspect, a photovoltaic module comprises a first outer protective layer comprising a glass sheet; a second outer protective layer comprising a glass sheet; and at least one crystalline silicon solar cell wafer between the first and second outer protective layers; wherein the composition of the glass sheets comprises:

| Component | Range (approx. wt %) |
|---|---|
| $SiO_2$ | 40-70 |
| $Al_2O_3$ | 0-30 |

| Component | Range (approx. wt %) |
|---|---|
| $B_2O_3$ | 0-30 |
| MgO | 0-12 |
| CaO | 0-35 |
| SrO | 0-20 |
| BaO | 0-33 |
| RO | 0-50 |
| $Na_2O$ | 0-1 |
| $K_2O$ | 0-5 |
| $M_2O$ | 0-5 |

In another aspect, a photovoltaic module comprises a first outer protective layer comprising a glass sheet; a second outer protective layer comprising a glass sheet; and at least one crystalline silicon solar cell wafer between the first and second outer protective layers; wherein the composition of the glass sheets comprises:

| Component | Range (approx. wt %) |
|---|---|
| $SiO_2$ | 50-70 |
| $Al_2O_3$ | 8-20 |
| $B_2O_3$ | 5-20 |
| MgO | 0-5 |
| CaO | 0-10 |
| SrO | 0-10 |
| BaO | 0-25 |
| RO | 0-25 |
| $Na_2O$ | 0-1 |
| $K_2O$ | 0-5 |
| $M_2O$ | 0-5 |

In another aspect, a photovoltaic module comprises a first outer protective layer comprising a glass sheet; a second outer protective layer comprising a glass sheet; and at least one crystalline silicon solar cell wafer between the first and second outer protective layers; wherein the composition of the glass sheets comprises:

| Component | Range (approx. wt %) |
|---|---|
| $SiO_2$ | 50-70 |
| $Al_2O_3$ | 8-18 |
| $B_2O_3$ | 7-17 |
| MgO | >0-5 |
| CaO | >0-10 |
| SrO | >0-10 |
| BaO | >0-10 |
| RO | 10-20 |
| $Na_2O$ | 0-1 |
| $K_2O$ | 0-5 |
| $M_2O$ | 0-5 |
| $SiO_2 + B_2O_3 + CaO$ | >57-85 |
| $Na_2O + K_2O + B_2O_3 +$ | >7-30 |
| $MgO + CaO + SrO$ | |
| $MgO + CaO + SrO$ | 0-25 |
| $(Na_2O + B_2O_3)—Al_2O_3$ | −11 to 9 |

In another aspect, a photovoltaic module comprises a first outer protective layer comprising a glass sheet; a second outer protective layer comprising a glass sheet; and at least one crystalline silicon solar cell wafer between the first and second outer protective layers; wherein the composition of the glass sheets comprises:

| Component | Range (approx. wt %) |
|---|---|
| $SiO_2$ | 63-70 |
| $Al_2O_3$ | >0-7 |
| $B_2O_3$ | 0-10 |
| MgO | >0-5 |
| CaO | 5-15 |
| SrO | 5-15 |
| BaO | 0-5 |
| RO | 10-25 |
| $Na_2O$ | 0-5 |
| $K_2O$ | 0-7 |
| $M_2O$ | 0-10 |
| $SiO_2 + B_2O_3 + CaO$ | >57-85 |
| $Na_2O + K_2O + B_2O_3 +$ | >7-35 |
| $MgO + CaO + SrO$ | |
| $MgO + CaO + SrO$ | 0-25 |
| $(Na_2O + B_2O_3)—Al_2O_3$ | −11 to 9 |

In another aspect, a photovoltaic module comprises a first outer protective layer comprising a glass sheet; a second outer protective layer comprising a glass sheet; and at least one crystalline silicon solar cell wafer between the first and second outer protective layers; wherein the composition of the glass sheets comprises:

| Component | Range (approx. wt %) |
|---|---|
| $SiO_2$ | 0-45 |
| $Al_2O_3$ | 0-35 |
| $B_2O_3$ | 0-30 |
| MgO | 0-12 |
| CaO | 0-67 |
| BaO | 0-33 |
| RO | 30-68 |

In another aspect, a photovoltaic module comprises a first outer protective layer comprising a glass sheet; a second outer protective layer comprising a glass sheet; and at least one crystalline silicon solar cell wafer between the first and second outer protective layers; wherein the composition of the glass sheets comprises:

| Component | Range (approx. wt %) |
|---|---|
| $SiO_2$ | 0-45 |
| $Al_2O_3$ | 0-35 |
| $B_2O_3$ | 0-30 |
| MgO | 0-12 |
| CaO | 0-67 |
| SrO | 0-19 |
| ZnO | 0-5 |
| BaO | 0-33 |
| RO | 30-68 |

In another aspect, a photovoltaic module comprises a first outer protective layer comprising a glass sheet; a second outer protective layer comprising a glass sheet; and at least one crystalline silicon solar cell wafer between the first and second outer protective layers; wherein the composition of the glass sheets comprises:

| Component | Range (approx. wt %) |
|---|---|
| $SiO_2$ | 35-45 |
| $Al_2O_3$ | 5-15 |
| $B_2O_3$ | 10-30 |
| MgO | 0-5 |
| CaO | 0-25 |
| SrO | 0-15 |

| Component | Range (approx. wt %) |
|---|---|
| BaO | 20-30 |
| RO | 20-40 |
| $Na_2O$ | 0-1 |
| $K_2O$ | 0-5 |
| $M_2O$ | 0-5 |

In another aspect, the photovoltaic modules listed above have improved reliability. In some embodiments of the photovoltaic modules listed above, the photovoltaic module exhibits an insulation resistance value of greater than 400 $M\Omega \cdot m^2$ when the wet leakage current is tested under the IEC 61215 measurement guidelines. In other embodiments, the module exhibits an insulation resistance value of greater than 4000 $M\Omega \cdot m^2$ when the wet leakage current is tested under the IEC 61215 measurement guidelines. In other embodiments, the photovoltaic module exhibits less than 10% output power degradation when exposed to approximately 2500 hours of 85° C./85% humidity per the IEC 61215 damp heat standard and −1000 V bias stressing. In other embodiments, the photovoltaic module exhibits less than 5% output power degradation when exposed to approximately 2500 hours of 85° C./85% humidity per the IEC 61215 damp heat standard and −1000 V bias stressing. In other embodiments, the photovoltaic modules listed above exhibit less than 10% fill factor degradation when exposed to approximately 2500 hours of 85° C./85% humidity per the IEC 61215 damp heat standard and −1000 V bias stressing. In other embodiments, the module exhibits less than 5% fill factor degradation when exposed to approximately 2500 hours of 85° C./85% humidity per the IEC 61215 damp heat standard and −1000 V bias stressing. In other embodiments, the photovoltaic module exhibits less than 10% series resistance increase when exposed to approximately 2500 hours of 85° C./85% humidity per the IEC 61215 damp heat standard and −1000 V bias stressing. In still other embodiments, the photovoltaic module exhibits less than 5% series resistance increase when exposed to approximately 2500 hours of 85° C./85% humidity per the IEC 61215 damp heat standard and −1000 V bias stressing.

In another aspect of the photovoltaic modules listed above, the photovoltaic module further comprises a hermetic/watertight seal along the edge and between the first and second outer protective layers to form a hermetically sealed cavity comprising the at least one crystalline silicon solar cell wafer.

In another aspect of the photovoltaic modules listed above, at least one of the glass sheets has an average surface roughness ($R_a$) of ≤20 Å, preferably ≤10 Å, wherein the glass sheet has not been polished. In another aspect of the photovoltaic modules listed above, at least one of the glass substrates has a thickness below 3 mm, and the glass substrate has a curvature deformation, W, less than 0.5 micrometer/cm², as described by the equation $W=D/L^2$, wherein D is the maximum curvature of glass substrate in μm and L is the diagonal length of glass substrate in cm.

In another aspect of the photovoltaic modules listed above, at least one glass sheet has a thickness of 1.8 mm or less. In another aspect of the photovoltaic modules listed above, at least one of the glass sheets has a thickness of 0.5 mm or less. In some embodiments, the glass sheet having a thickness of 0.5 mm or less is capable of being processed under roll-to-roll conditions. In another aspect of the photovoltaic modules listed above, the module further comprises a Na-containing structural glass sheet having a thickness of greater than 1.5 mm. In another aspect of the photovoltaic modules listed above, the glass composition further comprises >0-1 wt % $CeO_2$, $Fe_2O_3$, or $TiO_2$.

BRIEF DESCRIPTION OF THE DRAWINGS

The following detailed description of some embodiments can be best understood when read in conjunction with the following drawings, where like structure is indicated with like reference numerals and in which:

FIG. 13 provides a series of images pictorially showing the photovoltaic module performance graphed in FIG. 12B.

DETAILED DESCRIPTION

Figure 1A:
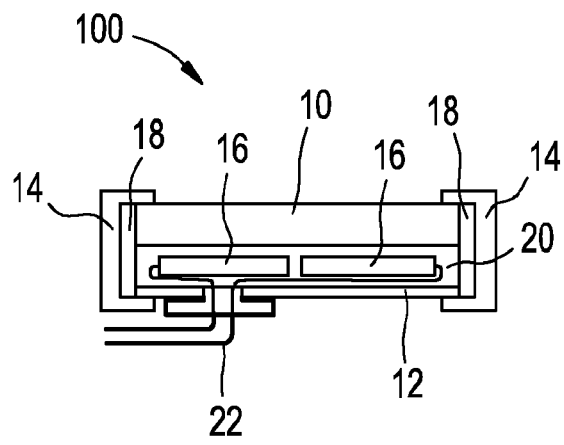
FIG. 1A and FIG. 1B show conventional cross sectional schematics of wafered and thin film modules, respectively.
Figure 1B:
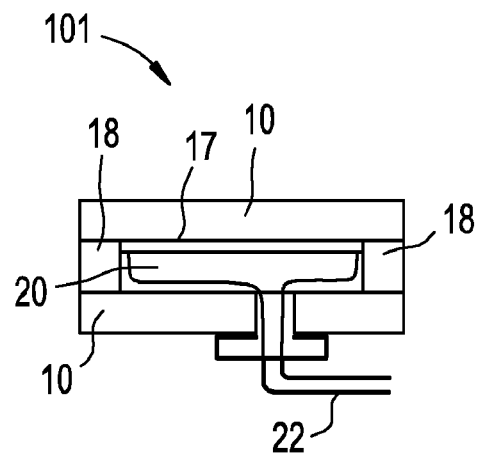
Figure 2:
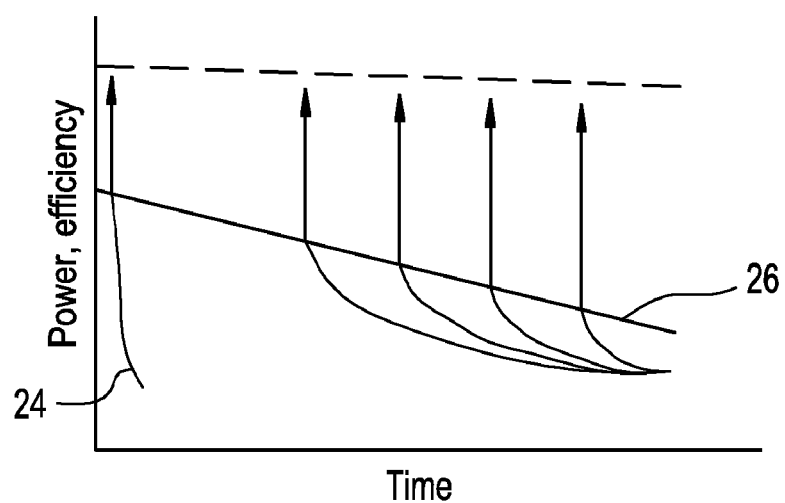
FIG. 2 are the paths to improve power generated and decrease LCOE or $/kwh produced.
Figure 3:
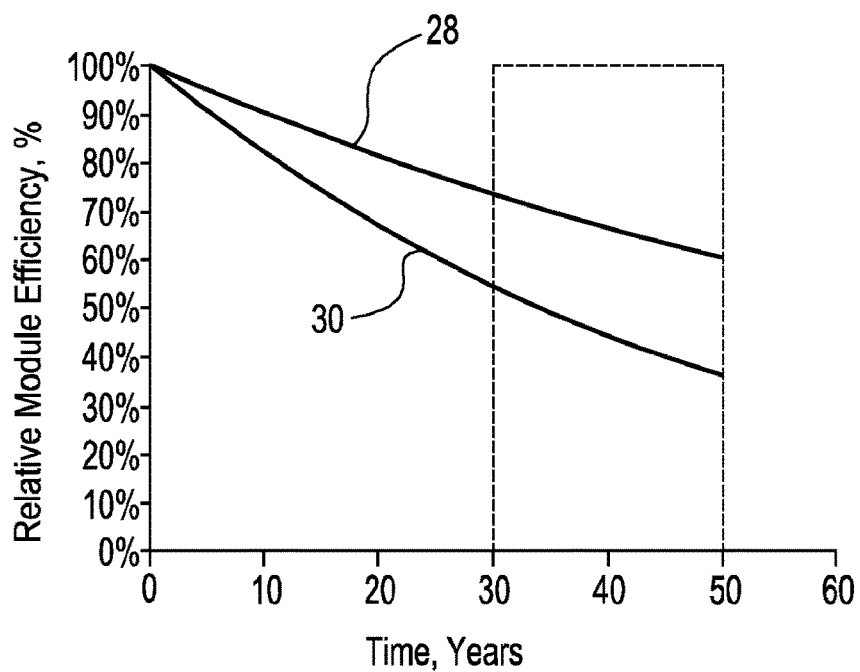
FIG. 3 charts module efficiencies at 1 and 2% degradation rates over 50 years.

In the following detailed description, numerous specific details may be set forth in order to provide a thorough understanding of embodiments of the invention. However, it will be clear to one skilled in the art when embodiments of the invention may be practiced without some or all of these specific details. In other instances, well-known features or processes may not be described in detail so as not to unnecessarily obscure the invention. In addition, like or identical reference numerals may be used to identify common or similar elements. Moreover, unless otherwise defined, all technical and scientific terms used herein have the same meaning as commonly understood by one of ordinary skill in the art to which this invention belongs. In case of conflict, the present specification, including the definitions herein, will control.

Although other methods and can be used in the practice or testing of the invention, certain suitable methods and materials are described herein.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein.

Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and/or C; D, E, and/or F; and the example combination A-D. Likewise, any subset or combination of these is also specifically contemplated and disclosed. Thus, for example, the subgroup of A-E, B-F, and C-E are specifically contemplated and should be considered disclosed from disclosure of A, B, and/or C; D, E, and/or F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

Moreover, where a range of numerical values is recited herein, comprising upper and lower values, unless otherwise stated in specific circumstances, the range is intended to include the endpoints thereof, and all integers and fractions within the range. It is not intended that the scope of the invention be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

The term "or", as used herein, is inclusive; more specifically, the phrase "A or B" means "A, B, or both A and B". Exclusive "or" is designated herein by terms such as "either A or B" and "one of A or B", for example.

The indefinite articles "a" and an are employed to describe elements and components of the invention. The use of these articles means that one or at least one of these elements or components is present. Although these articles are conventionally employed to signify that the modified noun is a singular noun, as used herein the articles "a" and an also include the plural, unless otherwise stated in specific instances. Similarly, the definite article "the", as used herein, also signifies that the modified noun may be singular or plural, again unless otherwise stated in specific instances.

For the purposes of describing the embodiments, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the claimed invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

It is noted that one or more of the claims may utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

As a result of the raw materials and/or equipment used to produce the glass composition of the present invention, certain impurities or components that are not intentionally added, can be present in the final glass composition. Such materials are present in the glass composition in minor amounts and are referred to herein as "tramp materials."

As used herein, a glass composition having 0 wt % of a compound is defined as meaning that the compound, molecule, or element was not purposefully added to the composition, but the composition may still comprise the compound, typically in tramp or trace amounts. Similarly, "sodium-free," "alkali-free," "potassium-free" or the like are defined to mean that the compound, molecule, or element was not purposefully added to the composition, but the composition may still comprise sodium, alkali, or potassium, but in approximately tramp or trace amounts.

There are two major drivers for photovoltaic (PV) module performance degradation over the life of a module: sodium contamination from the glass used to construct the module and water ingress through either the perimeter seal or through one or both of the faces of the module. The embodiments described herein leverages the advantages of certain specialty glasses (i.e., glasses specially designed for a precise application) to improve the long term reliability of PV modules, and hence the energy producing capability of both wafered Si and thin film technologies by reducing sodium contamination and water ingress failure modes. Glass compositions as described in U.S. patent application Ser. No. 13/305,051 and U.S. Prov. Pat. Appl. No. 61/522,956 are herein incorporated by reference in their entirety.

The terms "solar cell," "photovoltaic cell," "PV cell," "solar module," "photovoltaic module," "PV module," "solar device," "photovoltaic device," "PV device," or "device," as used herein, refer to any article that can convert light into electrical energy. Suitable solar cells include wafer-based solar cells (e.g., solar cells comprising materials selected from crystalline-Si (c-Si), ribbon Si, or multi-crystalline-Si (mc-Si) (also called polycrystalline Si), and mixtures thereof). A solar cell assembly can comprise one or a plurality of solar cells. The plurality of solar cells can be electrically interconnected or arranged in a flat plane. In addition, the solar cell assembly can further comprise conductive pastes or electrical wirings deposited upon the solar cells.

Monocrystalline silicon (c-Si) or multi-crystalline silicon (mc-Si) and ribbon silicon are the materials used most commonly in forming the wafer-based solar cells. Solar cell modules derived from wafer-based solar cells often comprise a series of self-supporting wafers (or cells) that are soldered together. The wafers generally have a thickness of between about 180 and about 240 µm. A panel of soldered solar cells, optionally along with a layer of conductive paste and/or electrical wirings such as conducting wires and bus bars deposited thereon, is often referred to as a solar cell layer or assembly. To form a weather resistant module, the solar cell assembly is typically sandwiched or laminated between two outer protective layers. These first and second outer protective layers insulate the solar cells from the environment and/or provide mechanical support to the module.

The outer protective layers comprise glass sheets and may optionally further comprise polymer, organic, or inorganic coatings, surface modifications, or other modifications to make them suitable for use in photovoltaic applications. Other modifications can include edge preparations, holes or slots for edge sealing, junction boxes, brackets or framing, etc.

$SiO_2$, an oxide involved in the formation of glass, functions to stabilize the networking structure of glass. In some embodiments, the glass composition comprises from 0 to about 70 wt % $SiO_2$. In some embodiments, the glass composition comprises from 0 to about 45 wt % $SiO_2$. In some embodiments, the glass composition can comprise from about 35 to about 45 wt % $SiO_2$. In some embodiments, the glass composition can comprise from about 40 to about 70 wt % $SiO_2$. In some embodiments, the glass composition can comprise from about 50 to about 70 wt % $SiO_2$. In some embodiments, the glass composition can comprise from about 55 to about 65 wt % $SiO_2$. In some embodiments, the glass composition can comprise from about 40 to about 70 wt %, about 40 to about 65 wt %, about 40 to about 60 wt %, about 40 to about 55 wt %, about 40 to about 50 wt %, about 40 to 45 wt %, 50 to about 70 wt %, about 50 to about 65 wt %, about 50 to about 60 wt %, about 50 to about 55 wt %, about 55 to about 70 wt %, about 60 to about 70 wt %, about 65 to about 70 wt %, about 60 to about 65 wt %, or about 55 to about 60 wt % $SiO_2$. In some embodiments, the glass composition can comprise from 0 to about 45 wt %, 0 to about 40 wt %, 0 to about 35 wt %, 0 to about 30 wt %, 0 to about 25 wt %, 0 to about 20 wt %, 0 to about 15 wt %, 0 to about 10 wt %, 0 to about 5 wt %, about 5 to about 45 wt %, about 5 to about 40 wt %, about 5 to about 35 wt %, about 5 to about 30 wt %, about 5 to about 25 wt %, about 5 to about 20 wt %, about 5 to about 15 wt %, about 5 to about 10 wt %, about 10 to about 45 wt %, about 10 to about 40 wt %, about 10 to about 35 wt %, about 10 to about 25 wt %, about 10 to about 20 wt %, about 10 to about 15 wt %, about 15 to about 45 wt %, about 15 to about 40 wt %, about 15 to about 35 wt %, about 15 to about 30 wt %, about 15 to about 25 wt %, about 15 to about 20 wt %, about 20 to about 45 wt %, about 20 to about 45 wt %, about 20 to about 40 wt %, about 20 to about 35 wt %, about 20 to about 30 wt %, about 20 to about 25 wt %, about 25 to about 45 wt %, about 25 to about 40 wt %, about 25 to about 35 wt %, about 25 to about 30 wt %, about 30 to about 45 wt %, about 30 to about 40 wt %, about 30 to about 35 wt %, about 35 to about 45 wt %, about 35 to about 40 wt %, or about 40 to about 45 wt % $SiO_2$. In some embodiments, the glass composition comprises about 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt % $SiO_2$.

$Al_2O_3$ may provide for a) maintaining the lowest possible liquidus temperature, b) lowering the expansion coefficient, or c) enhancing the strain point. In some embodiments, the glass composition can comprise from 0 to about 35 wt % $Al_2O_3$. In some embodiments, the glass composition can comprise from 0 to about 30 wt % $Al_2O_3$. In some embodiments, the glass composition can comprise from about 8 to about 20 wt % $Al_2O_3$. In some embodiments, the glass composition can comprise from about 5 to about 15 wt % $Al_2O_3$. In some embodiments, the glass composition can comprise from 0 to about 35 wt %, 0 to about 30 wt %, 0 to 25 wt %, 0 to 20 wt %, 0 to about 15 wt %, 0 to about 10 wt %, 0 to about 5 wt %, about 5 to about 35 wt %, about 5 to about 30 wt %, about 5 to about 25 wt %, about 5 to about 20 wt %, about 5 to about 15 wt %, about 5 to about 10 wt %, about 10 to about 35 wt %, about 10 to about 25 wt %, about 10 to about 20 wt %, about 10 to about 15 wt %, about 15 to about 35 wt %, about 15 to about 30 wt %, about 15 to about 25 wt %, about 15 to about 20 wt %, about 20 to about 35 wt %, about 20 to about 30 wt %, about 20 to about 25 wt %, about 25 to about 35 wt %, about 25 to about 30 wt %, or about 30 to about 35 wt % $Al_2O_3$. In some embodiments, the glass composition can comprise from about 8 to about 20 wt %, about 8 to about 18 wt %, about 8 to about 15 wt %, about 8 to about 12 wt %, about 8 to about 10 wt %, about 10 to about 20 wt %, about 10 to about 18 wt %, about 10 to about 15 wt %, about 10 to about 12 wt %, 12 to about 20 wt %, about 12 to about 18 wt %, about 12 to about 15 wt %, about 15 to about 20 wt %, about 15 to about 18 wt %, or about 18 to about 20 wt % $Al_2O_3$. In some embodiments, the glass composition can comprise about 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, or 35 wt % $Al_2O_3$.

$B_2O_3$ can be used as a flux to soften glasses, making them easier to melt. $B_2O_3$ may also react with non-bridging oxygen atoms (NBOs), converting the NBOs to bridging oxygen atoms through the formation of $BO_4$ tetrahedra, which increases the toughness of the glass by minimizing the number of weak NBOs. $B_2O_3$ also lowers the hardness of the glass which, when coupled with the higher toughness, decreases the brittleness, thereby resulting in a mechanically durable glass, which can be advantageous for substrates used in photovoltaic applications. In some embodiments, the glass composition can comprise from 0 to about 30 wt % $B_2O_3$. In some embodiments, the glass composition can comprise from about 10 to about 30 wt % $B_2O_3$. In some embodiments, the glass composition can comprise from about 5 to about 20 wt % $B_2O_3$. In some embodiments, the glass composition can comprise from about 7 to about 17 wt % $B_2O_3$. In some embodiments, the glass composition can comprise from 0 to about 30 wt %, 0 to 25 wt %, 0 to 20 wt %, 0 to about 15 wt %, 0 to about 10 wt %, 0 to about 5 wt %, about 5 to about 30 wt %, about 5 to about 25 wt %, about 5 to about 20 wt %, about 5 to about 15 wt %, about 5 to about 10 wt %, about 10 to about 25 wt %, about 10 to about 20 wt %, about 10 to about 15 wt %, about 15 to about 30 wt %, about 15 to about 25 wt %, about 15 to about 20 wt %, about 20 to about 30 wt %, about 20 to about 25 wt %, about 25 to about 30 wt %, or about 30 to about 35 wt %, $B_2O_3$. In some embodiments, the glass composition can comprise from about 5 to about 20 wt %, about 5 to about 18 wt %, about 5 to about 15 wt %, about 5 to about 12 wt %, about 5 to about 10 wt %, about 5 to about 8 wt %, about 8 to about 20 wt %, about 8 to about 18 wt %, about 8 to about 15 wt %, about 8 to about 12 wt %, about 8 to about 10 wt %, about 10 to about 20 wt %, about 10 to about 18 wt %, about 10 to about 15 wt %, about 10 to about 12 wt %, about 12 to about 20 wt %, about 12 to about 18 wt %, about 12 to about 15 wt %, about 15 to about 20 wt %, about 15 to about 18 wt %, or about 18 to about 20 wt % $B_2O_3$. In some embodiments, the glass composition can comprise about 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt % $B_2O_3$.

Since MgO, CaO and BaO are effective in decreasing the viscosity of glass at a higher temperature and enhancing the viscosity of glass at a lower temperature, they may be used for the improvement of the melting property and enhancement of the strain point. However, if excessive amounts of both MgO and CaO are used, there is an increasing trend toward phase separation and devitrification of the glass. As defined herein, RO comprises the wt % of MgO, CaO, SrO, and BaO. In some embodiments, the glass composition can comprise from 0 to about 68 wt % RO. In some embodiments, the glass composition can comprise from 0 to about 50 wt % RO. In some embodiments, the glass composition can comprise from 0 to about 25 wt % RO. In some embodiments, the glass composition can comprise from about 10 to about 25 wt % RO. In some embodiments, the glass composition can comprise from about 10 to about 25 wt % RO. In some embodiments, the glass composition comprises from about 30 to about 68 wt % RO. In some embodiments, the glass composition can comprise from about 20 to about 40 wt % RO. In some embodiments, the glass composition can comprise from 0 to about 25 wt % RO. In some embodiments, the glass composition can comprise from about 10 to about 20 wt % RO. In some embodiments, the glass composition can comprise from 0 to about 50 wt %, 0 to about 45 wt %, 0 to about 40 wt %, 0 to about 35 wt %, 0 to about 30 wt %, 0 to 25 wt %, 0 to 20 wt %, 0 to about 15 wt %, 0 to about 10 wt %, 0 to about 5 wt %, about 5 to about 50 wt %, about 5 to about 45 wt %, about 5 to about 40 wt %, about 5 to about 35 wt %, about 5 to about 30 wt %, about 5 to about 25 wt %, about 5 to about 20 wt %, about 5 to about 15 wt %, about 5 to about 10 wt %, about 10 to about 50 wt %, about 10 to about 45 wt %, about 10 to about 40 wt %, about 10 to about 35 wt %, about 10 to about 25 wt %, about 10 to about 20 wt %, about 10 to about 15 wt %, about 15 to about 50 wt %, about 15 to about 45 wt %, about 15 to about 40 wt %, about 15 to about 35 wt %, about 15 to about 30 wt %, about 15 to about 25 wt %, about 15 to about 20 wt %, about 20 to about 50 wt %, about 20 to about 45 wt %, about 20 to about 40 wt %, about 20 to about 45 wt %, about 20 to about 40 wt %, about 20 to about 35 wt %, about 20 to about 30 wt %, about 20 to about 25 wt %, about 25 to about 50 wt %, about 25 to about 45 wt %, about 25 to about 40 wt %, about 25 to about 35 wt %, about 25 to about 30 wt %, about 30 to about 50 wt %, about 30 to about 45 wt %, about 30 to about 40 wt %, about 30 to about 35 wt %, about 35 to about 50 wt %, about 35 to about 45 wt %, about 35 to about 40 wt %, about 40 to about 50 wt %, about 40 to about 45 wt %, or about 45 to about 50 wt % RO. In some embodiments, the glass composition can comprise from about 30 to about 68 wt %, about 30 to about 65 wt %, about 30 to about 60 wt %, about 30 to about 55 wt %, about 30 to about 50 wt %, about 30 to about 45 wt %, about 30 to about 40 wt %, about 30 to about 35 wt %, about 40 to about 68 wt %, about 40 to about 65 wt %, about 40 to about 60 wt %, about 40 to about 55 wt %, about 40 to 50 wt %, about 40 to 45 wt %, 50 to about 68 wt %, about 50 to about 65 wt %, about 50 to about 60 wt %, about 50 to about 55 wt %, about 55 to about 68 wt %, about 60 to about 68 wt %, about 65 to about 68 wt %, about 55 to about 65 wt %, or about 55 to about 60 wt % RO. In some embodiments, the glass composition can comprise about 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, or 68 wt % RO.

In some embodiments, MgO can be added to the glass to reduce melting temperature, increase strain point, or adjust CTE when used in combination with other alkaline earth compounds (e.g., CaO, SrO, and BaO). In some embodiments, the glass can comprise about 0 to about 12 wt % MgO. In some embodiments, the glass composition can comprise greater than 0 to about 5 wt % MgO. In some embodiments, the glass composition co can comprise greater than 0 to about 5 wt % MgO. In some embodiments, the glass composition can comprise 0 to about 12 wt %, 0 to about 10 wt %, 0 to about 8 wt %, 0 to about 5 wt %, 0 to about 4 wt %, 0 to about 3 wt %, 0 to about 2 wt %, 0 to about 1 wt %, about 1 to about 12 wt %, about 1 to about 10 wt %, about 1 to about 8 wt %, about 1 to about 5 wt %, about 1 to about 4 wt %, about 1 to about 3 wt %, about 1 to about 2 wt %, about 2 to about 12 wt %, about 2 to about 10 wt %, about 2 to about 8 wt %, about 2 to about 5 wt %, about 2 to about 4 wt %, about 2 to about 3 wt %, about 3 to about 12 wt %, about 3 to about 10 wt %, about 3 to about 8 wt %, about 3 to about 5 wt %, about 3 to about 4 wt %, about 4 to about 12 wt %, about 4 to about 10 wt %, about 4 to about 8 wt, about 4 to about 5 wt %, about 5 to about 12 wt %, about 4 to about 10 wt %, about 5 to about 8 wt %, about 8 to about 12 wt %, about 8 to about 10 wt %, about 10 to about 12 wt % MgO. In some embodiments, the glass compositions can comprise about 0, 1, 2, 3, 4, 5, 6, 7, 8, 9, 10, 11, or 12 wt % MgO.

In some embodiments, CaO can contribute to higher strain point, lower density, and lower melting temperature. More generally, it can be a component of certain possible devitrification phases, particularly anorthite ($CaAl_2Si_2O_8$), and this phase has complete solid solution with an analogous sodium phase, albite ($NaAlSi_3O_8$). CaO sources include limestone, an inexpensive material, so to the extent that volume and low cost are factors, in some embodiments it is can be useful to make the CaO content as high as can be reasonably achieved relative to other alkaline earth oxides. In some embodiments, the glass composition can comprise from 0 to about 67 wt % CaO. In some embodiments, the glass composition about from 0 to about 35 wt % CaO. In some embodiments, the glass composition can comprise from 0 to about 25 wt % CaO. In some embodiments, the glass composition can comprise from 0 to about 10 wt % CaO. In some embodiments, the glass composition can comprise from >0 to about 10 wt % CaO. In some embodiments, the glass composition can comprise from about 30 to about 68 wt %, about 30 to about 65 wt %, about 30 to about 60 wt %, about 30 to about 55 wt %, about 30 to about 50 wt %, about 30 to about 45 wt %, about 30 to about 40 wt %, about 30 to about 35 wt %, about 40 to about 68 wt %, about 40 to about 65 wt %, about 40 to about 60 wt %, about 40 to about 55 wt %, about 40 to 50 wt %, about 40 to 45 wt %, 50 to about 68 wt %, about 50 to about 65 wt %, about 50 to about 60 wt %, about 50 to about 55 wt %, about 55 to about 68 wt %, about 60 to about 68 wt %, about 65 to about 68 wt %, about 55 to about 65 wt %, or about 55 to about 60 wt % CaO. In some embodiments, the glass composition can comprise from 0 to about 50 wt %, 0 to about 45 wt %, 0 to about 40 wt %, 0 to about 35 wt %, 0 to about 30 wt %, 0 to about 25 wt %, 0 to about 20 wt %, 0 to about 15 wt %, 0 to about 10 wt %, 0 to about 5 wt %, about 5 to about 50 wt %, about 5 to about 45 wt %, about 5 to about 40 wt %, about 5 to about 35 wt %, about 5 to about 30 wt %, about 5 to about 25 wt %, about 5 to about 20 wt %, about 5 to about 15 wt %, about 5 to about 10 wt %, about 10 to about 50 wt %, about 10 to about 45 wt %, about 10 to about 40 wt %, about 10 to about 35 wt %, about 10 to about 25 wt %, about 10 to about 20 wt %, about 10 to about 15 wt %, about 15 to about 50 wt %, about 15 to about 45 wt %, about 15 to about 40 wt %, about 15 to about 35 wt %, about 15 to about 30 wt %, about 15 to about 25 wt %, about 15 to about 20 wt %, about 20 to about 50 wt %, about 20 to about 45 wt %, about 20 to about 45 wt %, about 20 to about 40 wt %, about 20 to about 35 wt %, about 20 to about 30 wt %, about 20 to about 25 wt %, about 25 to about 50 wt %, about 25 to about 45 wt %, about 25 to about 40 wt %, about 25 to about 35 wt %, about 25 to about 30 wt %, about 30 to about 50 wt %, about 30 to about 45 wt %, about 30 to about 40 wt %, about 30 to about 35 wt %, about 35 to about 50 wt %, about 35 to about 45 wt %, about 35 to about 40 wt %, about 40 to about 50 wt %, about 40 to about 45 wt %, or about 45 to about 50 wt % CaO. In some embodiments, the glass composition can comprise about 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, or 67 wt % CaO.

In some embodiments, the glasses can comprise 0 to 20 wt % SrO. SrO can contribute to higher coefficient of thermal expansion, and the relative proportion of SrO and CaO can be manipulated to improve liquidus temperature, and thus liquidus viscosity. In some embodiments, the glass can comprise from 0 to about 20 wt % SrO. In some embodiments, the glass can comprise from 0 to about 18 wt % SrO. In some embodiments, the glass can comprise from 0 to about 15 wt % SrO. In some embodiments, the glass can comprise from about to about 10 wt % SrO. In other embodiments, the glass can comprise greater than 0 to about 10 wt % SrO. In some embodiments, the glass composition can comprise from 0 to about 20 wt %, 0 to about 18 wt %, 0 to about 15 wt %, 0 to about 12 wt %, 0 to about 10 wt %, 0 to about 8 wt %, 0 to about 5 wt %, 0 to about 3 wt %, about 3 to about 20 wt %, about 3 to about 18 wt %, about 3 to about 15 wt %, about 3 to about 12 wt %, about 3 to about 10 wt %, about 3 to about 8 wt %, about 3 to about 5 wt %, about 5 to about 20 wt %, about 5 to about 18 wt %, about 5 to about 15 wt %, about 5 to about 12 wt %, about 5 to about 10 wt %, about 5 to about 8 wt %, about 8 to about 20 wt %, about 8 to about 18 wt %, about 8 to about 15 wt %, about 8 to about 12 wt %, about 8 to about 10 wt %, about 10 to about 20 wt %, about 10 to about 18 wt %, about 10 to about 15 wt %, about 10 to about 12 wt %, about 12 to about 20 wt %, about 12 to about 18 wt %, about 12 to about 15 wt %, about 15 to about 20 wt %, about 15 to about 18 wt %, or about 18 to about 20 wt %, SrO. In some embodiments, the glass composition can comprise about 0, 1, 2, 3, 4, 5, 6, 7, 8, 9, 10, 11, 12, 13, 14, 15, 16, 17, 18, 19, or 20 wt % BaO.

In some embodiments, the glass composition can comprise from 0 to 33 wt % BaO. In some embodiments, the glass composition can comprise from 0 to 25 wt % BaO. In some embodiments, the glass composition can comprise from about greater than 20 to about 30 wt % BaO. In some embodiments, the glass composition can comprise from >0 to 10 wt % BaO. In some embodiments, the glass composition can comprise 0 to about 33, 0 to about 30 wt %, 0 to about 25 wt %, 0 to about 23 wt %, 0 to about 20 wt %, 0 to about 18 wt %, 0 to about 15 wt %, 0 to about 12 wt %, 0 to about 10 wt %, 0 to about 8 wt %, 0 to about 5 wt %, 0 to about 3 wt %, about 3 to about 33 wt %, about 3 to about 30 wt %, about 3 to about 25 wt %, about 3 to about 23 wt %, about 3 to about 20 wt %, about 3 to about 18 wt %, about 3 to about 15 wt %, about 3 to about 12 wt %, about 3 to about 10 wt %, about 3 to about 8 wt %, about 3 to about 5 wt %, about 5 to about 33 wt %, about 5 to about 30 wt %, about 5 to about 25 wt %, about 5 to about 23 wt %, about 5 to about 20 wt %, about 5 to about 18 wt %, about 5 to about 15 wt %, about 5 to about 12 wt %, about 5 to about 10 wt %, about 5 to about 8 wt %, about 8 to about 33 wt %, about 8 to about 30 wt %, about 8 to about 25 wt %, about 8 to about 23 wt %, about 8 to about 20 wt %, about 8 to about 18 wt %, about 8 to about 15 wt %, about 8 to about 12 wt %, about 8 to about 10 wt %, about 10 to about 33 wt %, about 10 to about 30 wt %, about 10 to about 25 wt %, about 10 to about 23 wt %, about 10 to about 20 wt %, about 10 to about 18 wt %, about 10 to about 15 wt %, about 10 to about 12 wt %, about 12 to about 33 wt %, about 12 to about 30 wt %, about 12 to about 25 wt %, about 12 to about 23 wt %, 12 to about 20 wt %, about 12 to about 18 wt %, about 12 to about 15 wt %, about 15 to about 33 wt %, about 15 to about 30 wt %, about 15 to about 25 wt %, about 15 to about 23 wt %, about 15 to about 20 wt %, about 15 to about 18 wt %, about 18 to about 33 wt %, about 18 to about 30 wt %, about 18 to about 25 wt %, about 18 to about 23 wt %, about 18 to about 20 wt %, about 20 to about 33 wt %, about 20 to about 30 wt %, about 20 to about 25 wt %, about 20 to about 23 wt %, about 23 to about 33 wt %, about 23 to about 30 wt %, about 23 to about 25 wt %, about 25 to about 33 wt %, about 25 to about 30 wt %, or about 30 to about 33 wt % BaO. In some embodiments, the glass composition comprises about 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, or 33 wt % BaO.

Generally, alkali cations can raise the CTE steeply, but also can lower the strain point and, depending upon how they are added, they can increase melting temperatures. The least effective alkali oxide for raising CTE is $Li_2O$, and the most effective alkali oxide for raising CTE is $Cs_2O$. In some embodiments, the glass composition can comprise from 0 to about 5 wt % $M_2O$, wherein M is one or more of the alkali cations Na, Li, K, Rb, and Cs. In some embodiments, $M_2O$ can comprise only trace amounts of $Na_2O$. In some embodiments, $M_2O$ can comprise only trace amounts of $Na_2O$ and $K_2O$. In certain embodiments, the alkalis in question can be Li, K and Cs or combinations thereof. In some embodiments, the glass composition is substantially alkali free, for example, the content of alkali metal can be about 1 weight percent or less, 0.5 weight percent or less, 0.25 wt % or less, 0.1 wt % or less or 0.05 wt % or less. The glass sheets, according to some embodiments, can be substantially free of intentionally added alkali cations, compounds, or metals. In some embodiments, the glass composition can comprises from 0 to about 5 wt %, 0 to about 4 wt %, 0 to about 3 wt %, 0 to about 2 wt %, 0 to about 1 wt %, about 1 to about 5 wt %, about 1 to about 4 wt %, about 1 to about 3 wt %, about 1 to about 2 wt %, about 2 to about 5 wt %, about 2 to about 4 wt %, about 2 to about 3 wt %, about 3 to about 5 wt %, about 3 to about 4 wt, or about 4 to about 5 wt % $M_2O$. In some embodiments, the glass compositions can comprise about 0, 1, 2, 3, 4, or 5 wt % $M_2O$.

Figure 4A:
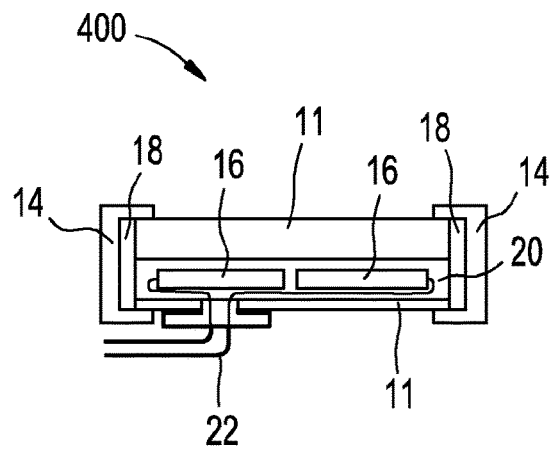
FIG. 4A and FIG. 4B are cross sectional schematics of embodiments of wafered (left) and thin film (right) modules based on specialty glass.
Figure 4B:
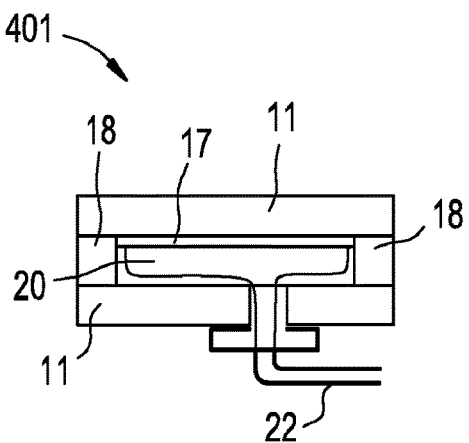

Sodium can be a mobile element or ion commonly used in standard window soda-lime glass compositions. The mobility of sodium can be problematic for the long-term reliability of PV modules since over the life of a PV module sodium can drift out of the glass under an applied field and migrate onto the active device layers of the module and degrade performance over time. FIG. 4 illustrates an embodiment where both the top glass and bottom glass of the wafered Si module and both top and bottom glass of the thin film module are replaced by low or no-sodium containing specialty glass. In both cases the specialty glass can have a significantly reduced thickness as compared to standard window glass, and as a result, dramatically reduce the weight of the module. By replacing the sodium of alkali-, containing glass in a PV module with specialty glasses that do not contain added sodium or, in certain embodiments, alkali, the sodium migration failure mode can be minimized. An exemplary photovoltaic module 400 for wafered silicon modules, shown in FIG. 4A, has at least two substantially sodium free or low sodium glass sheets 11, at least one silicon wafer 16 and at least one encapsulant layer 20 interposed between the glass sheets. The module can further comprise an edge seal 18, a metal frame 14, and electrical contacts 22 as shown by the cross section in FIG. 4A. An exemplary photovoltaic module 401 for thin film photovoltaic modules, shown in FIG. 4B, has at least two substantially sodium free or low sodium glass sheets 11, a thin film photovoltaic structure 17 and at least one encapsulant layer 20 interposed between the glass sheets. The module can further comprise an edge seal 18, a metal frame 14, and electrical contacts 22 as shown by the cross section in FIG. 4B.

The glass sheets are substantially sodium free, for example, when the content of $Na_2O$ is 0.5 weight percent or less, 0.25 wt % or less, 0.1 wt % or less, about 0.05 wt % or less, 0.001 wt % or less, 0.0005 wt % or less, or 0.0001 wt % or less. The glass sheets, according to some embodiments, are free of intentionally added sodium. In some embodiments, the glass can comprise from 0 to about 1 wt % $Na_2O$. In other embodiments, the glass can comprise greater than 0 to about 1 wt % $Na_2O$. In some embodiments, the glass composition can comprise from 0 to about 1 wt %, 0 to about 0.9 wt %, 0 to about 0.8 wt % 0 to about 0.7 wt %, 0 to about 0.6 wt %, 0 to about 0.5 wt %, 0 to about 0.4 wt %, 0 to about 0.3 wt %, 0 to about 0.2 wt %, 0 to about 0.1 wt %, 0.001 to about 1 wt %, 0.001 to about 0.9 wt %, 0.001 to about 0.8 wt %, 0.001 to about 0.7 wt %, 0.001 to about 0.6 wt %, 0.001 to about 0.5 wt %, 0.001 to about 0.4 wt %, 0.001 to about 0.3 wt %, 0.001 to about 0.2 wt %, 0.001 to about 0.1 wt %, 0.001 to about 0.01 wt %, 0.01 to about 1 wt %, 0.01 to about 0.9 wt %, 0.01 to about 0.8 wt %, about 0.01 to about 0.7 wt %, about 0.01 to about 0.6 wt %, about 0.01 to about 0.5 wt %, about 0.01 to about 0.4 wt %, about 0.01 to about 0.3 wt %, about 0.01 to about 0.2 wt %, about 0.01 to about 0.1 wt %, about 0.1 to about 1 wt %, about 0.1 to about 0.9 wt %, about 0.1 to about 0.8 wt %, about 0.1 to about 0.7 wt %, about 0.1 to about 0.6 wt %, about 0.1 to about 0.5 wt %, about 0.1 to about 0.4 wt %, about 0.1 to about 0.3 wt %, about 0.1 to about 0.2 wt %, about 0.2 to about 0.10 wt %, about 0.2 to about 0.9 wt %, about 0.2 to about 0.8 wt %, about 0.2 to about 0.7 wt %, about 0.2 to about 0.6 wt %, about 0.2 to about 0.5 wt %, about 0.2 to about 0.4 wt %, about 0.2 to about 0.3 wt %, about 0.3 to about 1 wt %, about 0.3 to about 0.9 wt %, about 0.3 to about 0.8 wt %, about 0.3 to about 0.7 wt %, about 0.3 to about 0.6 wt %, about 0.3 to about 0.5 wt %, about 0.3 to about 0.4 wt %, about 0.4 to about 1 wt %, about 0.4 to about 0.9 wt %, about 0.4 to about 0.8 wt %, about 0.4 to about 0.7 wt %, about 0.4 to about 0.6 wt %, about 0.4 to about 0.5 wt %, about 0.5 to about 1 wt %, about 0.5 to about 0.9 wt %, about 0.5 to about 0.8 wt %, about 0.5 to about 0.7 wt %, about 0.5 to about 0.6 wt %, about 0.6 to about 1 wt %, about 0.6 to about 0.9 wt %, about 0.6 to about 0.8 wt %, about 0.6 to about 0.7 wt %, about 0.7 to about 1 wt %, about 0.7 to about 0.9 wt %, about 0.7 to about 0.8 wt %, about 0.8 to about 1 wt %, about 0.8 to about 0.9 wt %, or about 0.9 to about 1 wt % $Na_2O$. In some embodiments, the glass can comprise about 0, 0.0001, 0.00025, 0.0005, 0.00075, 0.001, 0.002, 0.003, 0.004, 0.005, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1 wt % $Na_2O$.

As in the case of sodium, potassium is also an element or ion commonly found in standard window soda-lime glass compositions that has substantial mobility and may drift out of the glass. In some embodiments, the glass can comprise from 0 to about 5 wt % $K_2O$. In some embodiments, the glass composition can comprise greater than 0 to about 5 wt % $K_2O$. In some embodiments, the glass composition can comprise from 0 to about 5 wt %, 0 to about 4 wt %, 0 to about 3 wt %, 0 to about 2 wt %, 0 to about 1 wt %, about 1 to about 5 wt %, about 1 to about 4 wt %, about 1 to about 3 wt %, about 1 to about 2 wt %, about 2 to about 5 wt %, about 2 to about 4 wt %, about 2 to about 3 wt %, about 3 to about 5 wt %, about 3 to about 4 wt %, or about 4 to about 5 wt % $K_2O$. In some embodiments, the glass composition can comprise from 0 to about 1 wt %, 0 to about 0.9 wt %, 0 to about 0.8 wt %, 0 to about 0.7 wt %, 0 to about 0.6 wt %, 0 to about 0.5 wt %, 0 to about 0.4 wt %, 0 to about 0.3 wt %, 0 to about 0.2 wt %, or 0 to about 0.1 wt % $K_2O$. In some embodiments, the glass compositions comprises about 0, 1, 2, 3, 4, or 5 wt % $K_2O$.

Additional components can be incorporated into the glass compositions to provide additional benefits. For example, additional components can be added as fining agents (e.g., to facilitate removal of gaseous inclusions from melted batch materials used to produce the glass) and/or for other purposes. In some embodiments, the glass may comprise one or more compounds useful as ultraviolet radiation absorbers. In some embodiments, the glass can comprise 3 wt % or less $TiO_2$, MnO, ZnO, $Nb_2O_5$, $MoO_3$, $Ta_2O_5$, $WO_3$, $ZrO_2$, $Y_2O_3$, $La_2O_3$, $HfO_2$, CdO, $SnO_2$, $Fe_2O_3$, $CeO_2$, $As_2O_3$, $Sb_2O_3$, Cl, Br, or combinations thereof. In some embodiments, the glass can comprise from 0 to about 3 wt %, 0 to about 2 wt %, 0 to about 1 wt %, 0 to 0.5 wt %, 0 to 0.1 wt %, 0 to 0.05 wt %, or 0 to 0.01 wt % $TiO_2$, MnO, ZnO, $Nb_2O_5$, $MoO_3$, $Ta_2O_5$, $WO_3$, $ZrO_2$, $Y_2O_3$, $La_2O_3$, $HfO_2$, CdO, $SnO_2$, $Fe_2O_3$, $CeO_2$, $As_2O_3$, $Sb_2O_3$, Cl, Br, or combinations thereof. In some embodiments, the glass can comprise from 0 to about 3 wt %, 0 to about 2 wt %, 0 to about 1 wt %, 0 to about 0.5 wt %, 0 to about 0.1 wt %, 0 to about 0.05 wt %, or 0 to about 0.01 wt % $TiO_2$, $CeO_2$, or $Fe_2O_3$, or combinations thereof.

The glass composition, according to some embodiments, (e.g., any of the glasses discussed above) can include F, Cl, or Br, for example, as in the case where the glasses comprise Cl and/or Br as fining agents.

The glass composition, according to some embodiments, can comprise BaO. In certain embodiments, the glasses can comprise less than about 5, less than about 4, less than about 3, less than about 2, less than about 1, less than 0.5, or less than 0.1 wt % of BaO.

In some embodiments, the glass can be substantially free of $Sb_2O_3$, $As_2O_3$, or combinations thereof. For example, the glass can comprise 0.05 weight percent or less of $Sb_2O_3$ or $As_2O_3$ or a combination thereof, the glass may comprise zero weight percent of $Sb_2O_3$ or $As_2O_3$ or a combination thereof, or the glass may be, for example, free of any intentionally added $Sb_2O_3$, $As_2O_3$, or combinations thereof.

The glasses, according to some embodiments, can further comprise contaminants typically found in commercially-prepared glass. In addition, or alternatively, a variety of other oxides (e.g., $TiO_2$, MnO, ZnO, $Nb_2O_5$, $MoO_3$, $Ta_2O_5$, $WO_3$, $ZrO_2$, $Y_2O_3$, $La_2O_3$, $P_2O_5$, and the like) may be added, albeit with adjustments to other glass components, without compromising the melting or forming characteristics of the glass composition. In those cases where the glasses, according to some embodiments, further include such other oxide(s), each of such other oxides are typically present in an amount not exceeding about 3 wt %, about 2 wt %, or about 1 wt %, and their total combined concentration is typically less than or equal to about 5 wt %, about 4 wt %, about 3 wt %, about 2 wt %, or about 1 wt %. In some circumstances, higher amounts can be used so long as the amounts used do not place the composition outside of the ranges described above. The glasses, according to some embodiments, can also include various contaminants associated with batch materials and/or introduced into the glass by the melting, fining, and/or forming equipment used to produce the glass (e.g., $ZrO_2$).

In some embodiments, the glass composition can comprise:

| Component | Range (approx. wt %) |
|---|---|
| $SiO_2$ | 0-70 |
| $Al_2O_3$ | 0-35 |
| $B_2O_3$ | 0-30 |
| MgO | 0-12 |
| CaO | 0-67 |
| SrO | 0-20 |
| BaO | 0-33 |
| RO | 0-68 |
| $Na_2O$ | 0-1 |
| $K_2O$ | 0-5 |
| $M_2O$ | 0-5 |

Certain embodiments of suitable glass compositions are shown (in approximate wt %) in TABLE 1:

TABLE 1

| | 1 | 2 | 3 | 4 | 5 | 6 | 7 | 8 | 9 | 10 |
|---|---|---|---|---|---|---|---|---|---|---|
| $SiO_2$ | | | 4.14 | 4.27 | 8.81 | 13.2 | 14.6 | 6.61 | 13.6 | 20.9 |
| $Al_2O_3$ | 44.5 | 44.4 | 49.2 | 43.5 | 37.4 | 37.3 | 20.2 | 34.2 | 23.4 | 12 |
| $B_2O_3$ | | | | | | | | | | |
| MgO | 5.63 | 4.91 | | | | | 2.56 | 4.33 | 2.97 | 1.52 |
| CaO | 36.2 | 37.1 | 46.3 | 51.8 | 53.4 | 49.2 | 16.4 | 33.8 | 31.2 | 28.5 |
| SrO | | | | | | | | | | |
| BaO | 13.4 | 13.3 | | | | | 34.3 | 14.3 | 15.2 | 16.2 |

| | 11 | 12 | 13 | 14 | 15 | 16 | 17 | 18 | 19 | 20 |
|---|---|---|---|---|---|---|---|---|---|---|
| $SiO_2$ | 26.9 | 28.6 | 26.5 | 26.9 | 22.6 | 29.3 | 29.8 | 8.58 | 8.33 | 8.1 |
| $Al_2O_3$ | | | 5.48 | 5.96 | | | | 36.4 | 35.4 | 34.4 |
| $B_2O_3$ | 21.3 | 28.4 | 17.2 | 18.7 | 31.8 | 31.7 | 23 | | | |
| MgO | | | | | | | | 1.44 | 2.8 | 4.07 |
| CaO | | 25.7 | | 6.89 | 44.8 | 38.3 | 46.4 | 48 | 42.8 | 37.8 |
| SrO | 0.71 | 0.24 | 0.7 | 0.57 | | | | | | |
| BaO | 50.9 | 16.9 | 50 | 40.9 | | | | 5.48 | 10.6 | 15.5 |

| | 21 | 22 | 23 | 24 | 25 | 26 | 27 | 28 | 29 | 30 |
|---|---|---|---|---|---|---|---|---|---|---|
| $SiO_2$ | 8.6 | 8.08 | 8.43 | 8.52 | 7.27 | | 9.87 | 9.66 | 13.9 | 13.6 |
| $Al_2O_3$ | 36.5 | 34.3 | 32.2 | 28.9 | 30.7 | 44.5 | 20.1 | 26.2 | 20.2 | 26.4 |
| $B_2O_3$ | | | 2.44 | 4.94 | 4.89 | | 22.9 | 17.9 | 18.4 | 13.5 |
| MgO | 4.04 | 1.63 | 2.83 | 2.86 | 2.84 | 4.95 | | | | |
| CaO | 44.2 | 41.5 | 43.3 | 43.8 | 43.4 | 37 | 21 | 20.6 | 21.1 | 20.7 |
| SrO | | | | | | | 25.9 | 25.3 | 26 | 25.5 |
| BaO | 6.58 | 14.4 | 10.8 | 10.9 | 10.8 | 13.4 | | | | |

| | 31 | 32 | 33 | 34 | 35 | 36 | 37 | 38 | 39 | 40 |
|---|---|---|---|---|---|---|---|---|---|---|
| $SiO_2$ | 18 | 17.6 | 12 | 11.9 | 11.7 | 15.6 | 17.7 | 19.7 | 16 | 16.4 |
| $Al_2O_3$ | 20.3 | 26.6 | 20.4 | 23.5 | 26.6 | 26.5 | 26.7 | 26.8 | 27.1 | 27.8 |
| $B_2O_3$ | 13.9 | 9.07 | 20.8 | 18.3 | 15.9 | 13.6 | 13.7 | 13.7 | 13.9 | 14.2 |
| MgO | | | | | | | | | 2.68 | 5.49 |
| CaO | 21.3 | 20.8 | 22.4 | 22.1 | 21.9 | 19.7 | 18.7 | 17.7 | 17.9 | 16.1 |
| SrO | 26.2 | 25.6 | 24.1 | 23.9 | 23.6 | 24.3 | 23 | 21.8 | 22.1 | 19.8 |
| BaO | | | | | | | | | | |

TABLE 1-continued

|  | 41 | 42 | 43 | 44 | 45 | 46 | 47 | 48 | 49 | 50 |
|---|---|---|---|---|---|---|---|---|---|---|
| $SiO_2$ | 15.6 | 20.2 | 20.7 | 19.7 | 42.3 | 42.4 | 52.6 | 52.9 | 61.2 | 58.5 |
| $Al_2O_3$ | 26.4 | 27.4 | 28.1 | 26.7 | 19.1 | 22.2 | 15 | 18.1 | 14.8 | 13.9 |
| $B_2O_3$ | 13.5 | 14 | 14.4 | 13.7 | 7.86 |  | 8.14 |  |  | 2.68 |
| MgO |  | 2.71 | 5.56 |  |  | 1.74 |  | 1.44 | 1.18 | 1.32 |
| CaO | 17.4 | 15.8 | 13.9 | 15.4 | 13.6 | 26.8 | 10.8 | 21.8 | 18 | 18.3 |
| SrO | 21.5 | 19.5 | 17.1 | 19 | 16.8 |  | 13.2 |  |  |  |
| BaO |  |  |  |  |  | 6.62 |  | 5.48 | 4.5 | 5.04 |
| ZnO | 5.27 |  |  | 5.33 |  |  |  |  |  |  |
| $SnO_2$ |  |  |  |  | 0.21 | 0.22 | 0.22 | 0.23 | 0.23 | 0.23 |

|  | 51 | 52 | 53 | 54 | 55 | 56 | 57 | 58 | 59 | 60 |
|---|---|---|---|---|---|---|---|---|---|---|
| $SiO_2$ | 56.9 | 55.3 | 63.3 | 64.2 | 55.6 | 55.9 | 54.3 | 52.9 | 51.4 | 54.5 |
| $Al_2O_3$ | 13.5 | 13.1 | 13.1 | 9.71 | 13.2 | 13.2 | 12.9 | 12.5 | 12.2 | 12.9 |
| $B_2O_3$ | 5.36 | 8.02 |  |  |  |  | 2.49 | 4.98 | 7.46 | 2.5 |
| MgO | 1.28 | 1.25 | 1.25 | 1.4 | 5.01 | 3.01 | 4.9 | 4.77 | 4.64 | 2.94 |
| CaO | 17.8 | 17.3 | 17.3 | 19.1 | 6.96 | 8.41 | 6.82 | 6.62 | 6.45 | 8.16 |
| SrO |  |  |  |  |  | 7.73 |  |  |  | 7.56 |
| BaO | 4.89 | 4.76 | 4.77 | 5.32 | 19 | 11.4 | 18.4 | 18 | 17.5 | 11.2 |
| $SnO_2$ | 0.23 | 0.23 | 0.23 | 0.24 | 0.22 | 0.22 | 0.22 | 0.22 | 0.22 | 0.22 |

|  | 61 | 62 | 63 | 64 | 65 | 66 | 67 | 68 | 69 | 70 |
|---|---|---|---|---|---|---|---|---|---|---|
| $SiO_2$ | 53.1 | 51.7 | 21.1 | 22.4 | 21.6 | 22.3 | 23.1 | 22.2 | 22.9 | 23.7 |
| $Al_2O_3$ | 53.1 | 51.7 | 21.1 | 22.4 | 21.6 | 22.3 | 23.1 | 22.2 | 22.9 | 23.7 |
| $B_2O_3$ | 12.6 | 12.2 | 21.3 | 22.7 | 21.9 | 22.6 | 23.4 | 22.5 | 23.2 | 24 |
| MgO | 2.86 | 2.79 |  |  | 2.64 | 2.73 | 2.83 | 5.37 | 5.56 | 5.75 |
| CaO | 7.95 | 7.76 | 21.3 | 30.3 | 20 | 24.5 | 29.2 | 18.8 | 23.2 | 28.1 |
| SrO | 7.36 | 7.17 | 26.2 | 14 | 23.5 | 17.3 | 10.7 | 20.7 | 14.3 | 7.31 |
| BaO | 10.9 | 10.6 |  |  |  |  |  |  |  |  |
| $SnO_2$ | 0.22 | 0.22 |  |  |  |  |  |  |  |  |

In some embodiments, the glass compositions can comprise:

| Component | Range (approx wt %) |
|---|---|
| $SiO_2$ | 40-70 |
| $Al_2O_3$ | 0-30 |
| $B_2O_3$ | 0-30 |
| MgO | 0-12 |
| CaO | 0-35 |
| SrO | 0-20 |
| BaO | 0-33 |
| RO | 0-50 |
| $Na_2O$ | 0-1 |
| $K_2O$ | 0-5 |
| $M_2O$ | 0-5 |

Certain embodiments of suitable glass compositions are shown (in approximate wt %) in TABLE 2:

TABLE 2

|  | 1 | 2 | 3 | 4 | 5 | 6 | 7 | 8 | 9 | 10 |
|---|---|---|---|---|---|---|---|---|---|---|
| $SiO_2$ | 70 | 70 | 70 | 70 | 70 | 70 | 70 | 70 | 70 | 70 |
| $Al_2O_3$ | 30 | 20 | 20 | 20 | 20 | 20 | 20 | 20 | 20 | 20 |
| $B_2O_3$ |  | 10 |  |  |  |  |  | 5 | 5 | 5 |
| MgO |  |  | 10 |  |  |  | 5 |  |  |  |
| CaO |  |  |  | 10 | 5 |  | 5 |  | 5 | 3 |
| SrO |  |  |  |  | 5 |  |  |  |  |  |
| BaO |  |  |  |  |  | 10 |  | 2 |  | 1 |
| $K_2O$ |  |  |  |  |  |  |  | 3 |  | 1 |

|  | 11 | 12 | 13 | 14 | 15 | 16 | 17 | 18 | 19 | 20 |
|---|---|---|---|---|---|---|---|---|---|---|
| $SiO_2$ | 70 | 70 | 70 | 70 | 70 | 70 | 70 | 70 | 70 | 70 |
| $Al_2O_3$ | 10 | 10 | 10 | 10 | 10 | 10 | 0 | 0 | 0 | 0 |
| $B_2O_3$ | 20 | 10 | 10 | 10 | 10 | 10 | 30 | 20 | 10 | 0 |
| MgO |  | 10 |  |  |  |  |  |  | 5 | 5 |
| CaO |  |  | 10 | 5 |  | 5 |  | 5 | 5 | 10 |
| SrO |  |  |  |  |  |  |  |  |  | 5 |
| BaO |  |  |  |  | 10 | 2 |  | 5 | 5 | 5 |
| $K_2O$ |  |  |  |  |  | 3 |  |  |  | 5 |

|  | 21 | 22 | 23 | 24 | 25 | 26 | 27 | 28 | 29 | 30 |
|---|---|---|---|---|---|---|---|---|---|---|
| $SiO_2$ | 60 | 60 | 60 | 60 | 60 | 60 | 60 | 60 | 60 | 60 |
| $Al_2O_3$ | 30 | 30 | 30 | 30 | 30 | 25 | 25 | 25 | 25 | 25 |
| $B_2O_3$ | 10 |  |  |  | 4 | 15 |  | 5 |  | 8 |
| MgO |  | 8 |  |  | 1 |  | 4 | 2 | 1 |  |
| CaO |  | 2 | 10 | 3 | 3 |  | 6 | 5 | 4 |  |
| SrO |  |  | 5 |  |  |  | 2 | 1 |  |  |
| BaO |  |  | 2 | 2 |  |  | 3 | 1 | 2 | 15 |
| $K_2O$ |  |  |  | 1 |  |  |  |  |  |  |

|  | 31 | 32 | 33 | 34 | 35 | 36 | 37 | 38 | 39 | 40 |
|---|---|---|---|---|---|---|---|---|---|---|
| $SiO_2$ | 60 | 60 | 60 | 60 | 60 | 60 | 60 | 60 | 60 | 60 |
| $Al_2O_3$ | 20 | 20 | 20 | 20 | 20 | 15 | 15 | 15 | 15 | 15 |
| $B_2O_3$ | 20 | 15 | 10 | 5 | 0 | 25 | 20 | 10 | 0 | 0 |
| MgO |  |  |  | 3 | 5 |  |  | 3 | 8 |  |
| CaO |  | 5 | 8 | 5 |  | 5 |  | 4 | 12 | 25 |
| SrO |  |  |  | 5 | 5 |  |  | 2 | 1 |  |
| BaO |  | 2 | 7 | 5 |  |  | 6 | 4 |  |  |
| $K_2O$ |  |  |  |  |  |  | 1 |  |  |  |

|  | 41 | 42 | 43 | 44 | 45 | 46 | 47 | 48 | 49 | 50 |
|---|---|---|---|---|---|---|---|---|---|---|
| $SiO_2$ | 60 | 60 | 60 | 60 | 60 | 60 | 60 | 60 | 60 | 60 |
| $Al_2O_3$ | 15 | 15 | 15 | 15 | 15 | 10 | 10 | 10 | 10 | 10 |
| $B_2O_3$ | 10 | 10 | 10 | 10 | 10 | 30 | 20 | 10 | 0 | 0 |
| MgO | 2 | 4 | 4 | 2 | 3 |  | 1 | 3 |  | 7 |
| CaO | 8 | 10 | 7 | 6 | 5 |  | 5 | 5 | 15 | 8 |
| SrO | 3 | 1 | 4 | 2 | 2 |  | 2 |  |  | 5 |
| BaO | 2 |  | 1 | 5 | 3 |  | 2 | 2 | 15 | 10 |
| $K_2O$ |  |  |  |  | 2 |  |  |  |  |  |

|  | 51 | 52 | 53 | 54 | 55 | 56 | 57 | 58 | 59 | 60 |
|---|---|---|---|---|---|---|---|---|---|---|
| $SiO_2$ | 55 | 55 | 55 | 55 | 55 | 55 | 55 | 55 | 55 | 55 |
| $Al_2O_3$ | 30 | 25 | 20 | 20 | 20 | 20 | 15 | 10 | 10 | 10 |

TABLE 2-continued

| | | | | | | | | | | |
|---|---|---|---|---|---|---|---|---|---|---|
| $B_2O_3$ | 10 | | 5 | | | 7 | 15 | 17 | | 4 |
| MgO | | 7 | 5 | | 5 | 3 | 5 | 6 | 4 | 12 |
| CaO | 5 | 6 | 5 | 5 | 15 | 6 | | 8 | 18 | 2 |
| SrO | | 2 | 5 | | 5 | 1 | 5 | 2 | 7 | 2 |
| BaO | | 4 | 5 | 20 | | 7 | 4 | 2 | 6 | 14 |
| $K_2O$ | | 1 | | | | 1 | 1 | | | 1 |

| | 61 | 62 | 63 | 64 | 65 | 66 | 67 | 68 | 69 | 70 |
|---|---|---|---|---|---|---|---|---|---|---|
| $SiO_2$ | 55 | 55 | 55 | 55 | 55 | 55 | 55 | 55 | 55 | 55 |
| $Al_2O_3$ | 35 | 30 | 25 | 20 | 15 | 10 | 5 | 5 | 5 | |
| $B_2O_3$ | 5 | 10 | 5 | | 5 | 6 | 25 | 5 | 30 | |
| MgO | | | 7 | | 5 | 2 | 5 | 8 | 3 | |
| CaO | 5 | | 5 | | 5 | 20 | 10 | | 2 | 45 |
| SrO | | 3 | 2 | 7 | 5 | 4 | 3 | 7 | 2 | |
| BaO | | 2 | | 18 | 5 | 1 | 7 | 20 | 1 | |
| $K_2O$ | | | 1 | | 5 | | | | 1 | |

| | 71 | 72 | 73 | 74 | 75 | 76 | 77 | 78 | 79 | 80 |
|---|---|---|---|---|---|---|---|---|---|---|
| $SiO_2$ | 55 | 55 | 55 | 55 | 55 | 55 | 55 | 55 | 55 | 55 |
| $Al_2O_3$ | 20 | | 5 | 2 | 10 | | 5 | 15 | | |
| $B_2O_3$ | 10 | 10 | 15 | 15 | 20 | 20 | 30 | 30 | 20 | |
| MgO | | | 5 | 2 | | 55 | | | 3 | 3 |
| CaO | | 35 | | 14 | 15 | 12 | 3 | | 20 | 25 |
| SrO | 7 | | | | | 2 | | | 2 | 2 |
| BaO | 8 | | 20 | 10 | | 5 | 1 | | | 15 |
| $K_2O$ | | | | 2 | | 1 | 1 | | | |

| | 81 | 82 | 83 | 84 | 85 | 86 | 87 | 88 | 89 | 90 |
|---|---|---|---|---|---|---|---|---|---|---|
| $SiO_2$ | 50 | 50 | 50 | 50 | 50 | 50 | 50 | 50 | 50 | 50 |
| $Al_2O_3$ | 35 | 35 | 30 | 20 | 18 | 18 | 15 | 15 | 15 | 15 |
| $B_2O_3$ | 15 | 5 | 8 | 12 | 10 | 3 | 30 | 15 | 15 | 5 |
| MgO | | | 2 | | 5 | 10 | | 4 | 1 | 7 |
| CaO | | 5 | 1 | | 15 | 4 | 5 | 16 | 3 | 3 |
| SrO | | 3 | 3 | | 2 | 10 | | | 7 | 3 |
| BaO | | 2 | 4 | | | 4 | | | 9 | 5 |
| $K_2O$ | | | 2 | | | 1 | | | | 2 |

| | 91 | 92 | 93 | 94 | 95 | 96 | 97 | 98 | 99 | 100 |
|---|---|---|---|---|---|---|---|---|---|---|
| $SiO_2$ | 50 | 50 | 50 | 50 | 50 | 45 | 45 | 41 | 40 | 40 |
| $Al_2O_3$ | 12 | 12 | 10 | 10 | 10 | 5 | 5 | 9 | 5 | 20 |
| $B_2O_3$ | 18 | 5 | 30 | 15 | 0 | 30 | 5 | 22 | 12 | 0 |
| MgO | 5 | 13 | 1 | 10 | | 5 | 12 | | 12 | 5 |
| CaO | 5 | 5 | 4 | | 15 | 5 | 12 | | 20 | 15 |
| SrO | 5 | 8 | 2 | 7 | | 5 | 15 | | 3 | 5 |
| BaO | 5 | 5 | 3 | 5 | 25 | | 6 | 28 | 7 | 12 |
| $K_2O$ | | 2 | | 3 | | 5 | | | | 3 |

In some embodiments, the glass composition can comprise:

| Component | Range approx. wt % |
|---|---|
| $SiO_2$ | 50-70 |
| $Al_2O_3$ | 8-20 |
| $B_2O_3$ | 5-20 |
| MgO | 0-5 |
| CaO | 0-10 |
| SrO | 0-18 |
| BaO | 0-25 |
| RO | 0-25 |
| $Na_2O$ | 0-1 |
| $K_2O$ | 0-5 |
| $M_2O$ | 0-5 |

In some embodiments, the glass composition can comprise:

| Component | Range (approx. wt %) |
|---|---|
| $SiO_2$ | 50-70 |
| $Al_2O_3$ | 8-18 |
| $B_2O_3$ | 7-17 |
| MgO | >0-5 |
| CaO | >0-10 |
| SrO | >0-10 |
| BaO | >0-10 |
| RO | 10-20 |
| $Na_2O$ | 0-1 |
| $K_2O$ | 0-5 |
| $M_2O$ | 0-5 |
| $SiO_2 + B_2O_3 + CaO$ | >57-85 |
| $Na_2O + K_2O + B_2O_3 + MgO + CaO + SrO$ | >7-30 |
| $MgO + CaO + SrO$ | 0-25 |
| $(Na_2O + B_2O_3) - Al_2O_3$ | -11 to 9 |

Certain embodiments of suitable glass compositions, in approximate wt %, are shown in Table 3:

TABLE 3

| | 101 | 102 | 103 | 104 | 105 |
|---|---|---|---|---|---|
| $SiO_2$ | 56.4 | 62.3 | 62.5 | 58.9 | 60.1 |
| $Al_2O_3$ | 16.7 | 10.9 | 17.2 | 15.7 | 15.6 |
| $B_2O_3$ | 10.3 | 9.8 | 10.4 | 9.3 | 10.5 |
| MgO | 3.8 | 6.3 | 1.4 | 0.028 | 0.35 |
| CaO | 4.5 | 5.3 | 7.4 | 5.7 | 7.8 |
| SrO | 4.6 | 2.9 | 0.8 | 6.2 | 4.7 |
| BaO | 0.05 | 0.02 | 0.011 | 2.3 | 0.54 |
| RO | 13.0 | 14.6 | 9.6 | 14.2 | 13.4 |
| $Na_2O$ | 0.04 | 0.04 | 0 | 0 | 0 |
| $K_2O$ | 3.3 | 2.3 | 0 | 0 | 0 |
| $M_2O$ | 3.3 | 2.3 | 0 | 0 | 0 |
| $As_2O_3$ | | | 0.0002 | 0.57 | 0.0036 |
| $Sb_2O_3$ | | | 0.0002 | 0.55 | 0.018 |
| $SnO_2$ | 0.18 | 0.08 | 0.029 | 0.051 | 0.24 |
| $Fe_2O_3$ | | 0.15 | 0.0097 | | 0.012 |
| Cl | | <0.002 | <0.005 | | 0.052 |
| F | | 0.23 | 0.03 | | 0.05 |
| $ZrO_2$ | | 0.019 | 0.15 | | 0.042 |
| ZnO | 0.06 | 0.03 | 0.0007 | 0.46 | 0.0042 |
| Strain Pt. | 633° C. | | | | |
| CTE | 43.9 | | | | |

| | 106 | 107 | 108 | 109 | 110 |
|---|---|---|---|---|---|
| $SiO_2$ | 59.2 | 61.8 | 60.1 | 61.3 | 60.6 |
| $Al_2O_3$ | 15 | 15.6 | 16.8 | 16.0 | 16.8 |
| $B_2O_3$ | 11.2 | 11.2 | 7.6 | 7.8 | 11.6 |
| MgO | 0.56 | 1.2 | 3.2 | 2.8 | 1.7 |
| CaO | 4.6 | 5.0 | 3.9 | 8.3 | 5.4 |
| SrO | 3.0 | 2.5 | 7.7 | 0.029 | 2.7 |
| BaO | 5.6 | 2.0 | 0.092 | 3.2 | 0.69 |
| RO | 13.8 | 10.7 | 14.9 | 14.3 | 10.5 |
| $Na_2O$ | 0 | 0.73 | <0.0001 | <0.01 | Trace |
| $K_2O$ | 0 | 0.0017 | <0.0001 | <0.005 | Trace |
| $M_2O$ | 0 | 0.0001 | 0.001 | 0.17 | 0.27 |
| $As_2O_3$ | 0.75 | 0.14 | 0.062 | 0.13 | 0.06 |
| $Sb_2O_3$ | 0.007 | 0.008 | 0.21 | 0.073 | 0.015 |
| $SnO_2$ | 0.007 | <0.01 | 0 | 0.11 | 0.02 |
| $Fe_2O_3$ | 0.01 | 0.048 | 0.21 | 0.11 | 0.023 |
| Cl | <0.002 | 0.001 | 0.0004 | 0.02 | Trace |
| F | <0.01 | | | | |
| $ZrO_2$ | 0.035 | | | | |
| ZnO | 0.012 | | | | |

In some embodiments, the glass composition can comprise:

| Component | Range (approx. wt %) |
|---|---|
| $SiO_2$ | 55-65 |
| $Al_2O_3$ | 8-18 |
| $B_2O_3$ | 7-17 |
| MgO | >0-5 |
| CaO | >0-10 |
| SrO | >0-10 |
| BaO | >0-10 |
| RO | 10-20 |
| $Na_2O$ | 0-1 |
| $K_2O$ | 0-5 |
| $M_2O$ | 0-5 |
| $SiO_2 + B_2O_3 + CaO$ | >57-85 |
| $Na_2O + K_2O + B_2O_3 + MgO + CaO + SrO$ | >7-30 |
| $MgO + CaO + SrO$ | 0-25 |
| $(Na_2O + B_2O_3) - Al_2O_3$ | −11 to 9 |

In some embodiments, the glass composition comprises:

| Component | Range (wt %) |
|---|---|
| $SiO_2$ | 63-70 |
| $Al_2O_3$ | >0-7 |
| $B_2O_3$ | 0-10 |
| MgO | >0-5 |
| CaO | 5-15 |
| SrO | 5-15 |
| BaO | 0-5 |
| RO | 10-25 |
| $Na_2O$ | 0-5 |
| $K_2O$ | 0-7 |
| $M_2O$ | 0-10 |
| $SiO_2 + B_2O_3 + CaO$ | >57-85 |
| $Na_2O + K_2O + B_2O_3 + MgO + CaO + SrO$ | >7-35 |
| $MgO + CaO + SrO$ | 0-25 |
| $(Na_2O + B_2O_3) - Al_2O_3$ | −11 to 9 |

In some embodiments, the glass composition comprises:

| Component | Range (wt %) |
|---|---|
| $SiO_2$ | 0-45 |
| $Al_2O_3$ | 0-35 |
| $B_2O_3$ | 0-30 |
| MgO | 0-12 |
| CaO | 0-67 |
| BaO | 0-33 |
| RO | 30-68 |

In some embodiments, the glass composition can comprise:

| Component | Range (wt %) |
|---|---|
| $SiO_2$ | 0-45 |
| $Al_2O_3$ | 0-35 |
| $B_2O_3$ | 0-30 |
| MgO | 0-12 |
| CaO | 0-67 |
| SrO | 0-19 |
| ZnO | 0-5 |
| BaO | 0-33 |
| RO | 30-68 |

In some embodiments, the glass composition comprises:

| Component | Range (wt %) |
|---|---|
| $SiO_2$ | 35-45 |
| $Al_2O_3$ | 5-15 |
| $B_2O_3$ | 10-30 |
| MgO | 0-5 |
| CaO | 0-25 |
| SrO | 0-15 |
| BaO | 20-30 |
| RO | 20-40 |
| $Na_2O$ | 0-1 |
| $K_2O$ | 0-5 |
| $M_2O$ | 0-5 |

The glass sheets used in the outer protective layers can be any thickness that is reasonably useful for embodiments described. However, it is often ideal to make the PV modules as light as possible while still retaining structural rigidity. Additionally, use of thinner glass results in less light loss in the material. Any suitable glass thickness can be used. Glass sheet embodiments may have a thickness of about 4 mm or less, about 3 mm or less, about 2.9 mm or less, about 2.8 mm or less, about 2.7 mm or less, about 2.6 mm or less, about 2.5 mm or less, about 2.4 mm or less, about 2.3 mm or less, about 2.2 mm or less, about 2.1 mm or less, about 2.0 mm or less, about 1.9 mm or less, about 1.8 mm or less, about 1.7 mm or less, about 1.6 mm or less, about 1.5 mm or less, about 1.4 mm or less, about 1.3 mm or less, about 1.2 mm or less, about 1.1 mm or less, about 1.0 mm or less, 0.9 mm or less, 0.8 mm or less, 0.7 mm or less, 0.6 mm or less, 0.5 mm or less, 0.4 mm or less, 0.3 mm or less, 0.2 mm or less, 0.1 mm or less, about 900 µm or less, about 800 µm or less, about 700 µm or less, about 600 µm or less, about 500 µm or less, about 400 µm or less, about 300 µm or less, about 200 µm or less, about 100 µm or less, about 90 nm or less, about 80 µm or less, about 70 µm or less, about 80 µm or less, about 70 µm or less, about 60 µm or less, or about 50 µm or less.

The glass, according to some embodiments, can be down-drawable—that is, the glass is capable of being formed into sheets using down-draw methods such as, but not limited to, fusion draw and slot draw methods that are known to those skilled in the glass fabrication arts. Such down-draw processes are used in the large-scale manufacture of flat glass, for example, display glass or ion-exchangeable glass.

The fusion draw process uses an isopipe that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the isopipe. These outside surfaces extend down and inwardly so that they join at an edge below the drawing tank. The two flowing glass surfaces join at this edge to fuse and form a single flowing sheet. The fusion draw method offers the advantage that, since the two glass films flowing over the channel fuse together, neither outside surface of the resulting glass sheet comes in contact with any part of the apparatus. Thus, the surface properties are not affected by such contact.

The slot draw method is distinct from the fusion draw method. Here the molten raw material glass is provided to a conduit. The bottom of the conduit has an open slot that is wider in one dimension than the other dimension with a nozzle that extends the length of the slot. The molten glass flows through the slot/nozzle and is drawn downward as a continuous sheet there through and into an annealing region.

Compared to the fusion draw process, the slot draw process provides a thinner sheet, as only a single sheet is drawn through the slot, rather than two sheets being fused together, as in the fusion down-draw process.

In order to be compatible with down-draw processes, the glass compositions described herein can have high liquidus viscosity. In some embodiments, the glass composition can have a liquidus viscosity of about 10,000 poise or greater, about 20,000 poise or greater, about 30,000 poise or greater, about 40,000 poise or greater, about 50,000 poise or greater, about 60,000 poise or greater, about 70,000 poise or greater, about 80,000 poise or greater, about 90,000 poise or greater, about 100,000 poise or greater, about 110,000 poise or greater, about 1200,000 poise or greater, about 130,000 poise or greater, about 140,000 poise or greater, about 150,000 poise or greater, about 160,000 poise or greater, about 170,000 poise or greater, about 180,000 poise or greater, about 190,000 poise or greater, about 200,000 poise or greater, about 225,000 poise or greater, about 250,000 poise or greater, about 275,000 poise or greater, about 300,000 poise or greater, about 325,000 poise or greater, about 350,000 poise or greater, about 375,000 poise or greater, about 400,000 poise or greater, about 425,000 poise or greater, about 450,000 poise or greater, about 475,000 poise or greater, or about 500,000 poise or greater.

In some embodiments, the glass composition can have a strain point of about 500° C. or greater, about 510° C. or greater, about 520° C. or greater, about 530° C. or greater, about 540° C. or greater, about 550° C. or greater, about 560° C. or greater, about 570° C. or greater, about 580° C. or greater, about 590° C. or greater, about 600° C. or greater, about 610° C. or greater, about 620° C. or greater, about 630° C. or greater, about 640° C. or greater, about 650° C. or greater, about 660° C. or greater, about 670° C. or greater, about 680° C. or greater, about 690° C. or greater, or about 690° C. or greater.

In some embodiments, the glass can have a coefficient of thermal expansion of about $25 \times 10^{-7}$ or greater, about $26 \times 10^{-7}$ or greater, about $27 \times 10^{-7}$ or greater, about $28 \times 10^{-7}$ or greater, about $29 \times 10^{-7}$ or about greater, about $30 \times 10^{-7}$ or greater, about $31 \times 10^{-7}$ or greater, about $32 \times 10^{-7}$ or greater, about $33 \times 10^{-7}$ or greater, about $34 \times 10^{-7}$ or greater, about $35 \times 10^{-7}$ or greater, about $36 \times 10^{-7}$ or greater, about $37 \times 10^{-7}$ or greater, about $38 \times 10^{-7}$ or greater, about $39 \times 10^{-7}$ or greater, about $40 \times 10^{-7}$ or greater, about $41 \times 10^{-7}$ or greater, about $42 \times 10^{-7}$ or greater, about $43 \times 10^{-7}$ or greater, about $44 \times 10^{-7}$ or greater, about $45 \times 10^{-7}$ or greater, about $46 \times 10^{-7}$ or greater, about $47 \times 10^{-7}$ or greater, about $48 \times 10^{-7}$ or greater, about $49 \times 10^{-7}$ or greater, about $50 \times 10^{-7}$ or greater, about $51 \times 10^{-7}$ or greater, about $52 \times 10^{-7}$ or greater, about $53 \times 10^{-7}$ or greater, about $54 \times 10^{-7}$ or greater, about $55 \times 10^{-7}$ or greater, about $56 \times 10^{-7}$ or greater, about $57 \times 10^{-7}$ or greater, about $58 \times 10^{-7}$ or greater, about $59 \times 10^{-7}$ or greater, about $60 \times 10^{-7}$ or greater, about $61 \times 10^{-7}$ or greater, about $62 \times 10^{-7}$ or greater, about $63 \times 10^{-7}$ or greater, about $64 \times 10^{-7}$ or greater, about $65 \times 10^{-7}$ or greater, about $66 \times 10^{-7}$ or greater, about $67 \times 10^{-7}$ or greater, about $68 \times 10^{-7}$ or greater, about $69 \times 10^{-7}$ or greater, about $70 \times 10^{-7}$ or greater, about $71 \times 10^{-7}$ or greater, about $72 \times 10^{-7}$ or greater, about $73 \times 10^{-7}$ or greater, about $74 \times 10^{-7}$ or greater, about $75 \times 10^{-7}$ or greater, about $76 \times 10^{-7}$ or greater, about $77 \times 10^{-7}$ or greater, about $78 \times 10^{-7}$ or greater, about $79 \times 10^{-7}$ or greater, about $80 \times 10^{-7}$ or greater, about $81 \times 10^{-7}$ or greater, about $82 \times 10^{-7}$ or greater, about $83 \times 10^{-7}$ or greater, about $84 \times 10^{-7}$ or greater, about $85 \times 10^{-7}$ or greater, about $86 \times 10^{-7}$ or greater, about $87 \times 10^{-7}$ or greater, about $88 \times 10^{-7}$ or greater, about $89 \times 10^{-7}$ or greater, or about $90 \times 10^{-7}$ or greater.

In some embodiments, the glass sheets can be characterized as having strain points 540° C., thermal expansion coefficient of from 6.5 to 10.5 ppm/° C., as well as having liquidus viscosities in excess of 50,000 poise. As such they are ideally suited for being formed into sheet by the fusion process.

Alternatively, glass compositions may be formed via float or rolling processes known in the art β-OH, as used herein, is a measure of the hydroxyl content in the glass as measured by infrared spectroscopy, and is determined using the fundamental hydroxyl absorption for the glass. (U.S. Pat. No. 6,128,924, herein incorporated by reference in its entirety). β-OH is one way of measuring the water content in the glass. Water content can play a role in glass composition characteristics as well as possibly influencing device performance. In some embodiments, the glass composition comprises a β-OH value of from 0.1 to about 1, 0.1 to 0.9, 0.1 to 0.8, 0.1 to 0.7, 0.1 to 0.6, 0.1 to 0.5, 0.1 to 0.4, 0.1 to 0.3, 0.1 to 0.2, 0.2 to 0.10, 0.2 to 0.9, 0.2 to 0.8, 0.2 to 0.7, 0.2 to 0.6, 0.2 to 0.5, 0.2 to 0.4, 0.2 to 0.3, 0.3 to about 1, 0.3 to 0.9, 0.3 to 0.8, 0.3 to 0.7, 0.3 to 0.6, 0.3 to 0.5, 0.3 to 0.4, 0.4 to about 1, 0.4 to 0.9, 0.4 to 0.8, 0.4 to 0.7, 0.4 to 0.6, 0.4 to 0.5, 0.5 to about 1, 0.5 to 0.9, 0.5 to 0.5, 0.5 to 0.7, 0.5 to 0.6, 0.6 to about 1, 0.6 to 0.9, 0.6 to 0.8, 0.6 to 0.7, 0.7 to about 1, 0.7 to 0.9, 0.7 to 0.8, 0.8 to about 1, 0.8 to 0.9, or 0.9 to about 1. In some embodiments, the 13-0H value is 0.1, 0.2, 0.3, 0.4, 0.5, 0.6, 0.7, 0.8, 0.9, or 1.

Embodiments of the photovoltaic module may further comprise sealants, encapsulants, fillers, drying agents, ultraviolet radiation absorbers, and other materials. In some embodiments, the PV module may further comprise polymeric materials that may act as sealants, encapsulants, fillers, ultraviolet radiation absorbers, and other materials. In some of these embodiments, the polymers acting to prevent moisture ingress are below their glass transition temperature at all temperatures that the PV module will be exposed to. In some embodiments, the glass transition temperature of the polymeric materials comprising the encapsulant, sealant, or filler can have a glass transition temperature of greater than 60° C., 65° C., 70° C., 75° C., 80° C., 85° C., 90° C., or 95° C. Some of the polymers used in PV modules can degrade forming products that can be potentially harmful to the device, such as, for example, poly(ethylene vinyl acetate) that can degrade in the presence of water into acetic acid. In some embodiments, the polymers used can comprise materials decrease thermal or UV radiation-induced degradation into into caustic or other materials that could be harmful to the device.

Embodiments can comprise encapsulants, such as, for example, copolymers, poly(ethylene vinyl acetates) (EVA), poly(vinyl acetals) (e.g., poly(vinyl butyrals) (PVB)), polyurethanes, poly(vinyl chlorides), polyethylenes (e.g., linear low density polyethylenes), polyolefin block copolymer elastomers, copolymers of α-olefins and α,β-ethylenically unsaturated carboxylic acid esters) (e.g., ethylene methyl acrylate copolymers and ethylene butyl acrylate copolymers), silicone elastomers, epoxy resins, and combinations of two or more of these polymeric materials, and ionomers, such as DuPont's® PV5400, PV5300, PV5200, or PV8600. Embodiments also can comprise sealing materials to decrease or prevent moisture ingress, such as a butyl sealant or silicone sealant, at the module perimeter or junction box. Embodiments also can comprise adhesives or glues, such as epoxy or silicone, which may be applied in a liquid, paste, or solid form, such as a roll or tape.

Figure 5A:
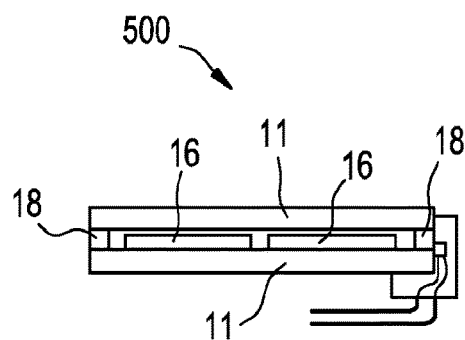
FIG. 5A and FIG. 5B are cross sections of an all-glass hermetic package for both wafer and thin film PV modules.
Figure 5B:
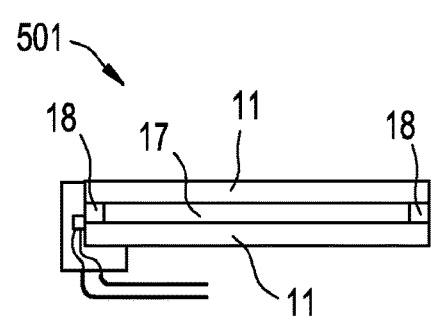

Another embodiment can address the water ingress failure mode. FIG. 5A and FIG. 5B show schematics of features 500 and 501 of photovoltaic modules which may decrease water ingress. The photovoltaic modules can have at least two substantially sodium free or low sodium glass sheets 11, a thin film photovoltaic structure 17 or at least one silicon wafer 16. The polymer based perimeter seal in the thin film module and silicon wafer module are replaced with an edge seal 18 comprising a fused glass or glass frit, thus creating a substantially hermetic water barrier. This can be significant, because water ingress is very difficult to manage using polymers and usually results in physically thick seals to obtain adequate performance. Nevertheless, polymer based seals can be inherently unreliable depending on the environmental conditions that they are subjected to. Fused glass/frit seals are inert and stable under a variety of environmental conditions and are ideal for eliminating water ingress in all-glass packaging schemes such as that described here.

It should be highlighted that the substantially hermetic package shown in some embodiments represents a significant improvement in module reliability. By combining substantially sodium free or low sodium specialty glass with substantially hermetic fused glass/frit seal the two most deleterious failure modes, sodium migration and water ingress, can be minimized. In addition, by using thin specialty glass the weight of module can be significantly reduced. By replacing two sheets of 3.2 mm soda-lime glass with two sheets of 0.7 mm specialty glass, the weight of a 1 square meter module can be reduced from 32.5 pounds to 7 pounds; a 78% reduction in weight. Finally, the hermetic nature of a fused glass/frit seal enables the active area of a module to be increased since a thinner seal can be used. For example, thin film modules typically use a polymer perimeter seal thickness of 12 mm. By reducing the seal thickness to 3 mm for a 1 m×1 m module the active area of the module can be increased from 94% to 98%, corresponding to an 11.3% to 11.7% increase in module efficiency assuming an active area efficiency of 12%.

Figure 6:
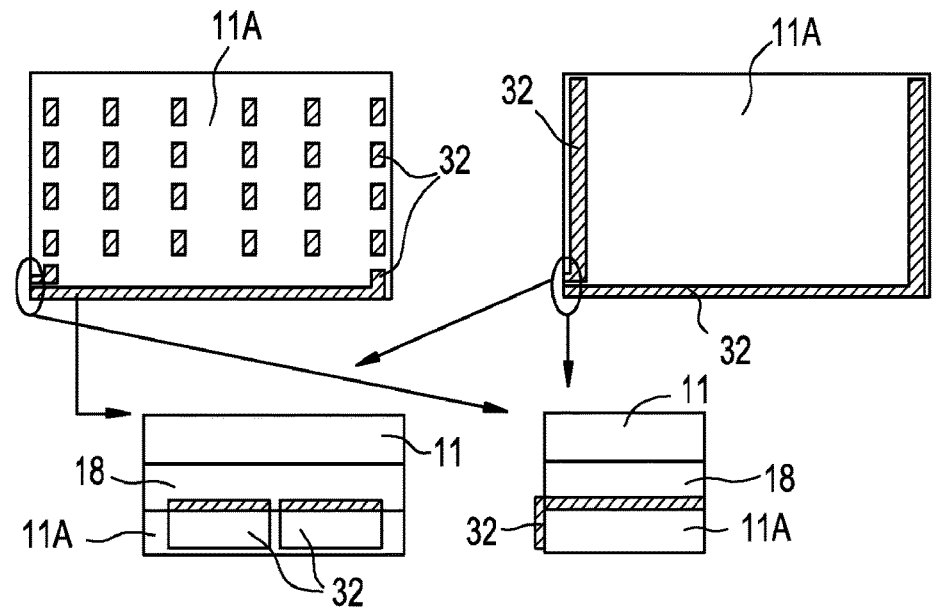
FIG. 6 is a schematic illustrating the contacts routed to the edge of a photovoltaic module for connection to a junction box.

One aspect of the substantially hermetic package can be the feed-through for making electrical connections to the active layers of the PV module. In this case an edge mounted junction box can be required, and as such, the electrical contacts should be routed out through the side of the module. FIG. 6 illustrates embodiments to accomplish this routing. In this case, the electrical contacts 32, for example, metal contacts can be deposited on one of the glass sheets which can be the bottom glass sheet 11A in the module by shadow masking and some form of physical vapor deposition. The metal contacts can be routed to the edge of the bottom glass sheet where they are physically available for connection to the junction box. It can be important that hermeticity be maintained at the edge where the contacts pass through the fused glass/frit edge seal 18.

In some embodiments, a functional layer can be disposed on the glass substrate of the first outer protection layer. The functional layer can be selected from an anti-glare layer, an anti-smudge layer, a self-cleaning layer, an anti-reflection layer, an anti-fingerprint layer, an ultra-violet protection layer, an optically scattering layer, and combinations thereof.

In some embodiments, one or more additional glass sheets can be incorporated into the PV module on the side of one of the outer protective layers opposite the solar cell wafer. The additional sheet is useful as structural components and may or may not have sodium in its composition. The additional glass sheet can have a thickness sufficient to add structural stability to the device. In some embodiments, the additional glass sheet can have a thickness of about 1.5 mm, about 1.6 mm, about 1.7 mm, about 1.8 mm, about 1.9 mm about, 2.0 mm, about 2.1 mm, about 2.2 mm, about 2.3 mm, about 2.4 mm, about 2.5 mm, about 2.6 mm, about 2.7 mm, about 2.8 mm, about 2.9 mm, about 3.0 mm, about 3.1 mm, about 3.2 mm, about 3.3 mm, about 3.4 mm, or about 3.5 mm.

Photovoltaic modules as embodied herein can show dramatically better performance when compared to previous devices. A variety of methods have been created to test module stability and performance. One test is the Wet leakage current test. (See, International Standard IEC 61215, Crystalline silicon terrestrial photovoltaic (PV) modules—Design qualification and type approval, pp. 77-79, International Electrotechnical Commission (Second Ed., April 2005), herein incorporated by reference in its entirety). IEC 61215. The purpose of the Wet leakage current test is to evaluate the insulation of the module against moisture penetration under wet operating conditions (rain, fog, dew, melted snow), to avoid corrosion, ground fault and thus electric shock hazard. The module is submersed in a shallow tank to a depth covering all surfaces except cable entries of junction boxes not designed for immersion (lower than IPX7). A test voltage is applied between the shorted output connectors and the water bath solution up to the maximum system voltage of the module for 2 minutes. The insulation resistance shall be not less than 40 MΩ for every square meter for modules with an area larger than 0.1 m². The Wet leakage current test is ranked as one of the most reoccurring failures during PV qualification at testing laboratories. In some embodiments, the Wet-leakage current test was performed with 600V for 2 minutes per the IEC 61215 measurement guidelines.

Another methods to test module stability and performance is the Damp-heat test ("DH"). (See, International Standard IEC 61215, Crystalline silicon terrestrial photovoltaic (PV) modules—Design qualification and type approval, pp. 73-75, International Electrotechnical Commission (Second Ed., April 2005), herein incorporated by reference in its entirety). The Damp-heat test is an environmental test that simulates the long field times of PV modules by exposing the modules to very severe conditions and monitoring a variety of performance criteria. The DH test can be done for any number of hours, but is often done under 1000 hours or 2500 hours. The purpose is to determine the ability of the module to withstand long-term exposure to penetration of humidity by applying a temperature of 85° C.±2° C. with a relative humidity of 85%±5% for 1000 (DH1000) or 2500 (DH2500) hours and may be done at an applied voltage, such as −1000 V. The DH1000 test is the most "malign" test, and on the top-list of failure rates in some laboratories accounting for up to 40-50% of total failures for c-Si modules. Similar failures rates can be observed for DH1000 also with thin-film. The DH2500 is even harsher, as the time is extended an additional 150%. The severity of this test particularly challenges the lamination process and the edge sealing from humidity. Delamination and corrosion of cell parts can be observed as a result of humidity penetration. Even in case of no major defects detected after DH1000, it is often the case that the module has been stressed to the point that it becomes "fragile" and is incapable of passing the subsequent mechanical load test. In some embodiments, the Damp-heat test was done for 1000 hours. In other embodiments, the Damp-heat test was done for 2500 hours.

In other embodiments, the Damp-heat test was done for more than 2500 hours. In some embodiments, the Damp-heat test is done at −1000 V.

Output power degradation as a result of the Damp-heat test can be directly measured. In some embodiments, a PV module can less than about 15%, less than about 14%, less than about 13%, less than about 12%, less than about 11%, less than about 10%, less than about 9%, less than about 8%, less than about 7%, less than about 6%, less than about 5%, less than about 4%, less than about 3%, or less than 2 about % output power degradation when exposed to a Damp-heat test of 85° C.±2° C. with a relative humidity of 85%±5% for 1000 hours at −1000V. In some embodiments, the PV module shows less than about 15%, less than about 14%, less than about 13%, less than about 12%, less than about 11%, less than about 10%, less than about 9%, less than about 8%, less than about 7%, less than about 6%, less than about 5%, or less than about 4%, output power degradation when exposed to a Damp-heat test of 85° C.±2° C. with a relative humidity of 85%±5% for 2500 hours at −1000 V.

Fill factor is another property that can be measured as a function of the Damp-heat test. Fill factor directly influences the module output power. A mechanism that influences the fill factor is ion migration, such as sodium ions, from the module glass to the silicon cell region that leads to shunting and eventually an undesired reduction in the fill factor. In some embodiments, the PV module can show less than about 15%, less than about 14%, less than about 13%, less than about 12%, less than about 11%, less than about 10%, less than about 9%, less than about 8%, less than about 7%, less than about 6%, less than about 5%, less than about 4%, less than about 3%, or less than about 2% degradation in the fill factor when exposed to a Damp-heat test of 85° C.±2° C. with a relative humidity of 85%±5% for 1000 hours at −1000V. In some embodiments, the PV module shows less than 15%, less than 14%, less than 13%, less than 12%, less than 11%, less than 10%, less than 9%, less than 8%, less than 7%, less than 6%, less than 5%, or less than 4%, degradation in the fill factor when exposed to a Damp-heat test of 85° C.±2° C. with a relative humidity of 85%±5% for 2500 hours at −1000 V.

The series resistance is another property that can be measured as a function of the Damp-heat test. Series resistance can enable a module to perform at a higher efficiency thus generating greater output power. Moisture ingress, such as through a polymeric back sheet, can lead to electrode corrosion that increases the module series resistance, and, ultimately degrade the module output power. In some embodiments, the increase in series resistance is less than about 15%, less than about 14%, less than about 13%, less than about 12%, less than about 11%, less than about 10%, less than about 9%, less than about 8%, less than about 7%, less than about 6%, less than about 5%, less than about 4%, less than about 3%, or less than about 2% when exposed to a Damp-heat test of 85° C.±2° C. with a relative humidity of 85%±5% for 1000 hours at −1000 V. In some embodiments, the increase in low series resistance is less than about 15%, less than about 14%, less than about 13%, less than about 12%, less than about 11%, less than about 10%, less than about 9%, less than about 8%, less than about 7%, less than about 6%, less than about 5%, or less than about 4%, when exposed to a Damp-heat test of 85° C.±2° C. with a relative humidity of 85%±5% for 2500 hours at −1000 V.

One factor that can play a role in PV module reliability is device quality. Poor quality glass substrates can lead to inconsistencies in manufacturing and subsequent poor device performance and reliability. In some embodiments, the average surface roughness of at least one of the glass sheets is about 20 Å or less, about 19 Å or less, about 18 Å or less, about 17 Å or less, about 16 Å or less, about 15 Å or less, about 14 Å or less, about 13 Å or less, about 12 Å or less, about 11 Å or less, or about 10 Å or less as measured by the SEMI STD D15-1296 FPD Glass Substrate Surface Waviness Measurement Method. In some embodiments, this average surface roughness can be achieved with no grinding or polishing or other post-forming process on the glass sheet.

Another factor that can play a role in PV module reliability is the curvature or warpage of the glass sheets. Thin glass sheets can be deformed by processing or the application of films or materials to either the interior or exterior surface. The deformation can cause problems with adhesion of the encapsulants, adhesives, or sealants that ultimately lead to degradation. In some embodiments, at least one outer protective layer can have a warp deformation amount W of about 3 mm/cm$^2$ or less, about 2 mm/cm$^2$ or less, about 1.5 mm/cm$^2$ or less, about 1.0 mm/cm$^2$ or less, 0.9 mm/cm$^2$ or less, 0.8 mm/cm$^2$ or less, 0.7 mm/cm$^2$ or less, 0.6 mm/cm$^2$ or less, 0.5 mm/cm$^2$ or less, 0.4 mm/cm$^2$ or less, 0.3 mm/cm$^2$ or less, 0.2 mm/cm$^2$ or less, or 0.1 mm/cm$^2$ or less, wherein W is found via the formula $W=D/L^2$ wherein D is the maximum warpage of the glass substrate in micrometers and L is the diagonal length of the outer protective layer in cm.

Figure 7:
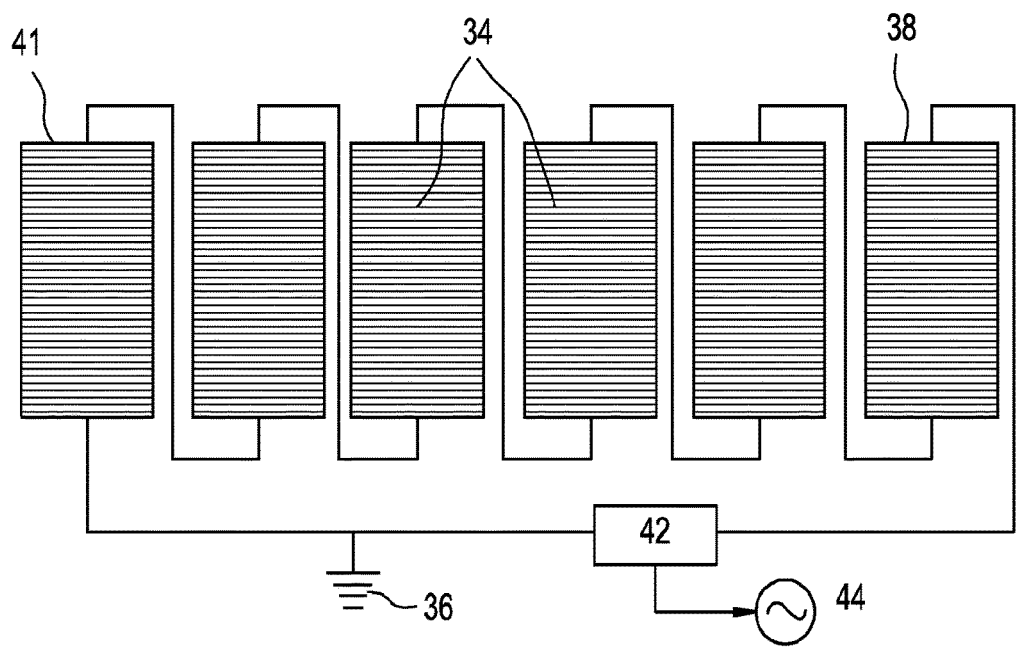
FIG. 7 is a schematic illustrating multiple modules connected in series to an inverter.

The improvements in module efficiency degradation rates can be used to increase the total power generated over the module lifetime as described above. It also can enable an increased number of modules that can be placed in series. FIG. 7 illustrates a number of PV modules 34 connected in series. One end of the chain can be at ground potential 36. The other end can have a high positive or negative potential 38 depending upon on how the system is designed. Modules at this end of the chain experiencing this higher potential will have higher degradation rates than those at lower potentials 41. The decreased degradation rates resulting from the use of thin specialty glass and hermetic sealing can enable longer module chains at acceptable degradation rates. The circuit can have an AC output 44 and an inverter 42.

Figure 8:
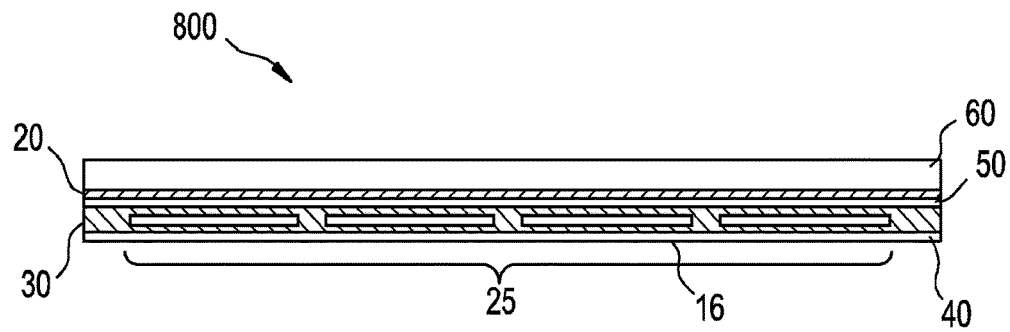
FIG. 8 is a schematic illustration of a photovoltaic module according to one embodiment of the present disclosure.

A photovoltaic module 800 according to an embodiment is illustrated schematically in FIG. 8 and comprises a plurality of photovoltaic wafers, for example, silicon wafers 16, for example, crystalline silicon wafers, one encapsulant layer 20, for example a wafer encapsulant, at least two substantially sodium free glass sheets, for example, a first outer protective layer 40, a second outer protective layer 50, and an additional glass layer 60. The photovoltaic wafers 16 define an active area 25 of the photovoltaic module 800 and are at least partially surrounded by a wafer encapsulant 30 between the first outer protective layer 40 and the second outer protective layer 50.

The first outer protective layer 40 and the second outer protective layer 50 can comprise UltraThin Flexible (UTF) specialty glasses—specialty glasses having a thickness or about 100 μm or less, and, as such, are less than approximately 100 μm in thickness across a substantial entirety of the active area 25 of the photovoltaic module and in some embodiments define a degree of flexibility that can be sufficient for non-destructive storage in a roll form. The respective glass compositions of the first outer protective layer 40 and the second outer protective layer 50 can be derived from a variety of conventional and yet-to-be developed UTF specialty glasses, with the restriction that suitable glasses will be substantially sodium-free. For example, and not by way of limitation, suitable UTF comprise alumino, aluminoboro-, and boro-silicate glasses. The resulting module can be highly hermetic and thus resistant to water ingress, can be extremely light weight, and can be scaled to larger size formats without exceeding typical installation weight limits.

The additional glass layer 60 can be a Na-based glass, defined as comprising more than approximately 1 weight % Na, and having a thickness and rigidity greater than that of the first outer protective layer 40 and the second outer protective layer 50. The additional glass layer 60 can be secured directly to the second outer protective layer 50 and, as such, defines a PV structure-free zone between it and the second outer protective layer 50.

In the illustrated embodiment, the photovoltaic wafers can be separated from the additional glass layer 60 by the second outer protective layer 50 to form a Na migration barrier between the additional glass layer 60 and the photovoltaic wafers 20. However, the photovoltaic wafers can be separated from the additional glass layer 60 by the first outer protective layer 40 or the second outer protective layer 50. In either case, the resulting impurity barrier will impede impurity migration from the additional glass layer 60 into the UTF-encapsulated portions of the module. Impurities could be, among other things, alkali metals that diffuse out of the strengthened structural glass and into the active device layers, and hence, degrade device performance. The resulting PV module can be manufactured as a high efficiency thin-film module and presents a path to low cost PV modules that leverages both the packaging and manufacturing benefits of UTF specialty glass.

Figure 10:
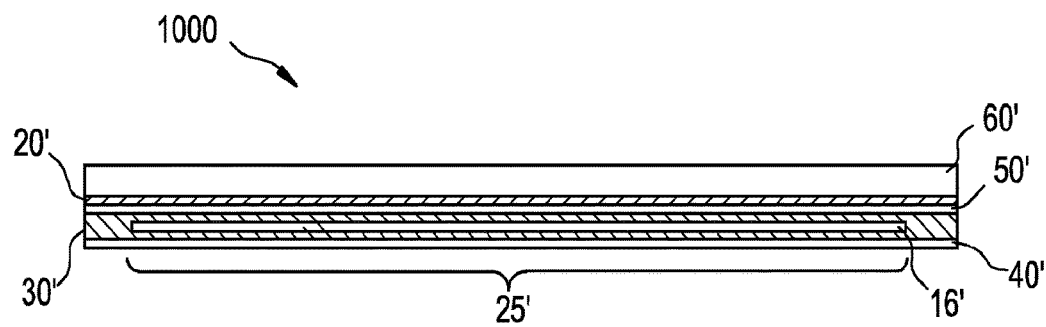
FIG. 10 is a schematic illustration of a photovoltaic module according to an alternative embodiment of the present disclosure.

PV wafers can be presented in a variety of forms including, but not limited to, wafered-Si PV applications. Alternatively, a photovoltaic module 1000, as is illustrated in FIG. 10, where like structure is illustrated with like reference numbers, the PV wafers, for example, silicon wafers 16 can be replaced by thin-film PV structure 16' including, but not limited to, CdTe, Si-Tandem, a-Si, and copper indium gallium (di)selenide (CIGS) thin film structures. Although the concepts of the present disclosure are described herein primarily in the specific context of PV wafers, as opposed to thin-film or other PV technology, it is noted that reference herein to PV structure is intended to encompass a variety of PV applications including, but not limited to PV wafers and thin-film PV structure.

In some embodiments of the present disclosure, the first outer protective layer 40 and the second outer protective layer 50 can be selected to define a degree of flexibility that can be sufficient to mitigate increases in module thickness arising from topography variations between the first outer protective layer 40 and the second outer protective layer 50. For example, individual sheets of CIGS cells on UTF specialty glass can be assembled using a commercially available encapsulant material (such as EVA, PVB, ionomer, etc) and standard PV module lamination equipment and techniques. Typical sheets of encapsulant material are 0.5 mm thick and allow for some topography variation in the adjoining glass sheets. The flexibility of the UTF specialty glass first outer protective layer 40 and second outer protective layer 50 can provide a means to further conform to small deviations in flatness between the first outer protective layer 40 and second outer protective layer 50 and thus enables the use of a thinner (0.25 mm or thinner) encapsulant sheet, further reducing module costs.

For example, in certain embodiments, the degree of flexibility of the outer protective layers can be sufficient for self-weighted, substantially failure-free (less than 1% failure probability) bending at a bend radius of less than approximately 100 cm. In more limited cases, where flexibility is a primary concern, the degree of flexibility of the outer protective layers can be sufficient for self-weighted, substantially failure-free bending at a bend radius of less than approximately 30 cm.

Although we note above that UTF specialty glasses are typically less than approximately 0.7 mm thick and, more generally, less than approximately 2.0 mm in thickness across a substantial entirety of the active area 25 of the photovoltaic module, some embodiments can glass sheets for the first outer protective layer 40 and/or second outer protective layer 50 that are between approximately 0.05 mm and approximately 0.3 mm in thickness across the substantial entirety of the active area 25 of the photovoltaic module. In some embodiments, glass sheet thicknesses can be less than or equal to approximately 0.3 mm. Different thicknesses for the glass sheets can be used to optimize the overall strength of the final assembly and minimize cost.

In some embodiments, operational efficiency can be enhanced and device degradation minimized by using glass compositions for the outer protective layers that are substantially alkali-free. In some embodiments, the glass compositions of the first outer protective layer 40 and the second outer protective layer 50 can be characterized by coefficients of thermal expansion matching that of the photovoltaic wafers—at least over an operating temperature range of the photovoltaic module, i.e., from about −45° C. to about 150° C. This CTE match can enable the use of very thin Si wafers to minimize cost. The CTE match could also enable the elimination of one encapsulant layer, most likely the layer between the wafers and substrate UTF glass to reduce manufacturing complexity and cost.

In many cases, the additional glass layer 60 can comprise a soda-lime glass composition. However, the additional glass layer 60 can be viewed generally as high transmission, strengthened structural glass, like tempered, low-Fe soda-lime glass, or any structural glass suitable for the formation of a readily deployable UTF specialty glass-based wafered-Si module.

Figure 9:
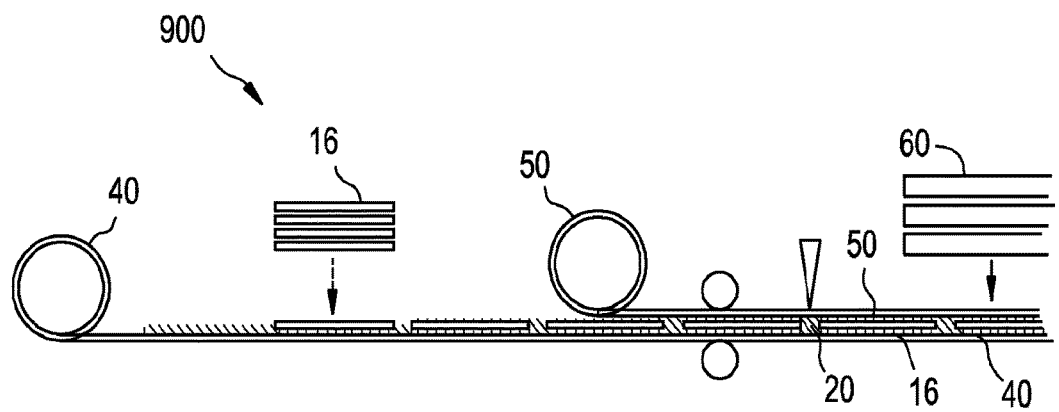
FIG. 9 is a schematic illustration of a photovoltaic module manufacturing process according to one embodiment of the present disclosure.

FIG. 9 is a schematic illustration of a method 900 of fabricating photovoltaic modules according to the present disclosure. As we note above, PV modules embodiment can comprise a plurality of photovoltaic wafers, for example, silicon wafers 16, an encapsulant layer 20, for example, a wafer encapsulant, a first outer protective layer 40, a second outer protective layer 50, and an additional glass layer 60. According to the fabrication process the first outer protective layer 40 and second outer protective layer 50 are provided in rolled form. A plurality of photovoltaic wafers is positioned over an unrolled portion of the first outer protective layer 40 to define the active area of the photovoltaic module. The photovoltaic wafers, so positioned, are encapsulated with the wafer encapsulant and an unrolled portion of the second outer protective layer 50 can be positioned over the photovoltaic wafers, the wafer encapsulant, and the first outer protective layer 40. Subsequently, the additional glass layer 60 is positioned over the second outer protective layer 50. The fabrication process further comprises a dicing operation, illustrated schematically at 70 in FIG. 9, where discrete module subassemblies are created prior to positioning the Additional glass layer 60 over the out protective layer.

EXAMPLES

Example 1

Figure 11:
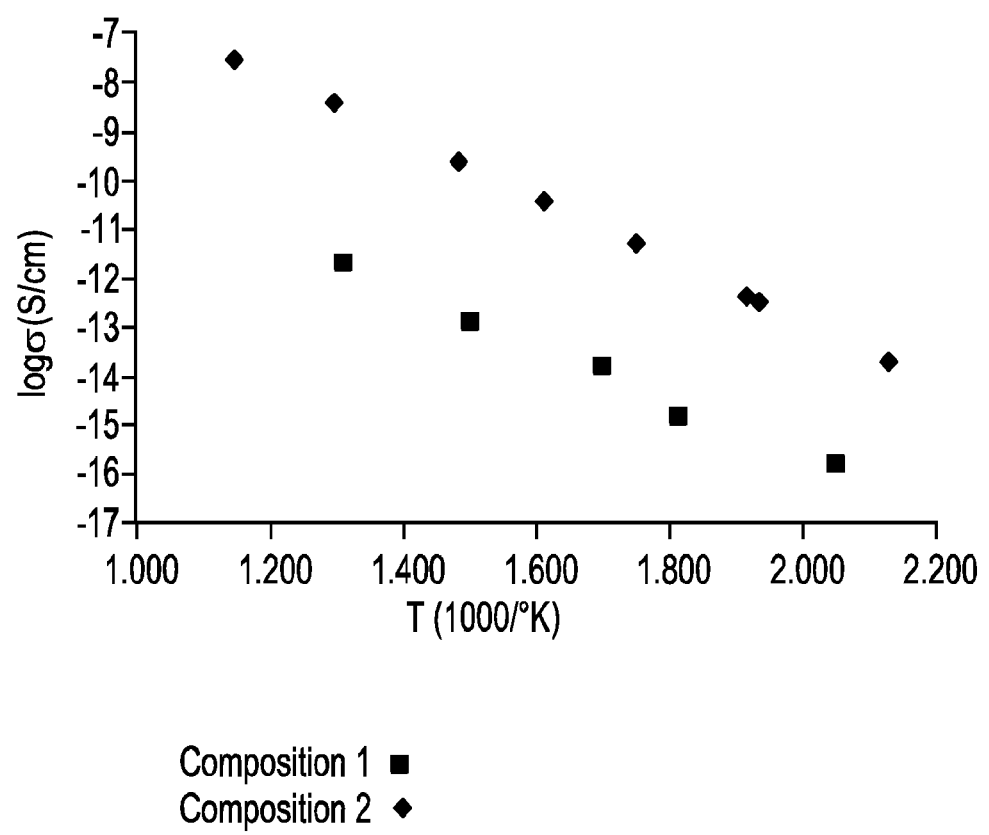
FIG. 11 is a graph of the volume conductivity versus temperature.

Conduction of electrical charge in glass is primarily due to ions in response to an applied voltage. The volume conductivity (which is the inverse of the resistivity) of glass as shown in FIG. 11 is obtained using established sample preparation protocols and measurement techniques. The glass samples under test are prepared as described in ASTM D257, where flat samples are finished to a defined area and thickness before gold electrodes are fired on opposite flat surfaces to form a parallel-plate capacitor. Electrical connections are then made to the sample and placed in a furnace as described by ASTM C657. The impedance of the parallel-plate electrode sample is measured using an impedance spectrum analyzer and the conductivity is calculated using the following two descriptions for resistivity $\rho$ ($\Omega$·cm): (1) $\rho=R\cdot(A/t)$, where R=is the resistance ($\Omega$) and A and t are the effective area and thickness of the sample, respectively; and (2) $\rho=\rho_0 \cdot e^{(-E_A/k_B T)}$ where $\rho_0$ is the pre-exponential factor ($\Omega$·cm), $E_A$ is the activation energy (eV), $k_B$ is Boltzmann constant and T is temperature (K).

Example 2

The Wet leakage test is performed at +600 V and stabilized for 2 minutes per the IEC 61215 measurement guidelines. The minimum measurement requirement for modules is 40 Mohm*$m^2$.

TABLE 1

| | M$\Omega \cdot m^2$ | | |
|---|---|---|---|
| | Max | Min | Avg |
| SLG front sheet/ polymer back sheet | 109.89 | 82.14 | 88.12 |
| Comp. 106/106 | 74740.00 | 7437.00 | 34332.64 |

Wherein "SLG" is a standard soda lime glass front sheet and the back sheet comprised a Tedlar polymer. From our measurements, a soda lime glass (SLG)/polymer package passes the IEC requirement. The embodied PV module package comprises front and back sheet glass sheet compositions of composition 106 (TABLE 3). The embodied PV module package passes with >3 orders of magnitude better margin in performance. The higher resistance from the embodied PV package is in part attributed to the >3 orders of magnitude higher resistivity of the 106 glass versus SLG.

Example 3

Potential induced degradation ("PID") is tested via the Damp-heat test on a number of photovoltaic modules to compare the reliability, performance, and stability of the embodiments. Standard c-Si module design is used, with all devices comprising components from either Construction 1 or Construction 2 (See TABLE 4). The modules all comprise c-Si cells, encapsulant coating, front and back sheet components, a framing gasket, an extruded aluminum frame, junction box and junction box adhesive.

TABLE 4

| Panel BOM | Construction 1 | Construction 2 |
|---|---|---|
| Cells | SolarTech Multi-Crystalline SiN ARC 15% to 17% | DelSolar Mono-Crystalline SiN ARC 17% to 19% |
| Encapsulant | STR EVA 15420 | STR EVA 15295 |
| Back sheet | Madico Tedlar/PET/Tedlar | Madico Protekt HD Protekt/PET/EVA |
| Frame | Extruded Al | Extruded Al |
| Framing Gasket | SG V9000 | Dow Corning PV804 |

TABLE 4-continued

| Panel BOM | Construction 1 | Construction 2 |
|---|---|---|
| Junction Box | Tyco | ZJRH |
| Junction Box Adhesive | Momentive RTV108 | Dow Corning PV804 |

Figure 12A:
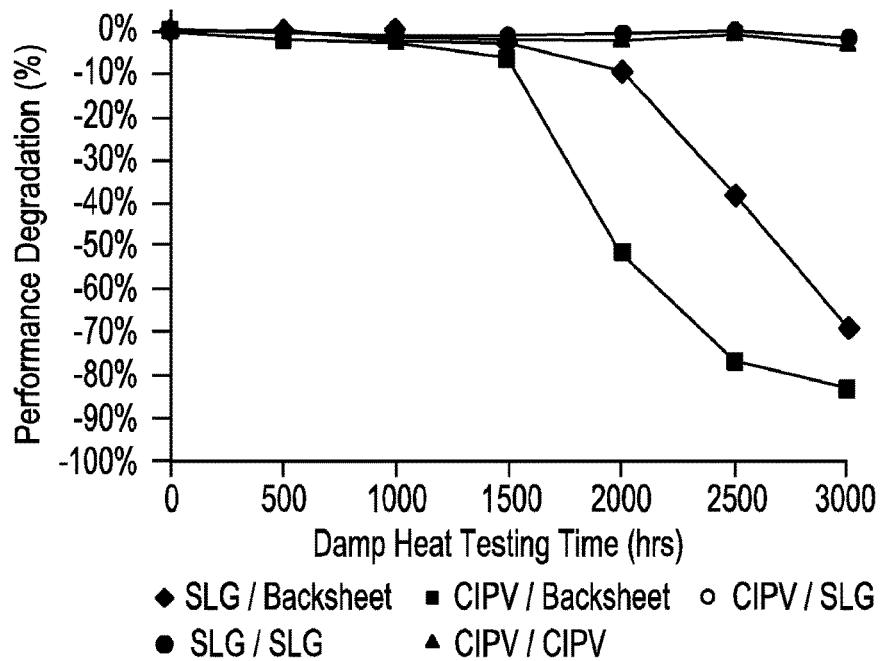
FIG. 12A and FIG. 12B show the performance degradation of certain photovoltaic modules (referred to as "Construction 1") with a variety of cover materials. The figures show the photovoltaic modules under no bias (FIG. 12A) and −1000 V bias (FIG. 12B).
Figure 12B:
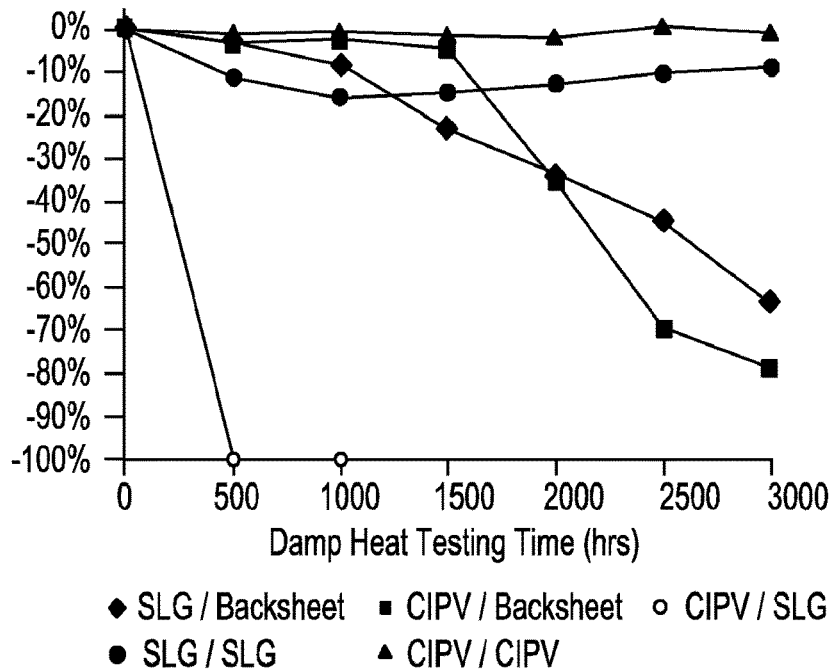

Components from Construction list 1 are used to make five different PV modules—1) soda lime glass front sheet/polymer back sheet; 2) soda lime glass front sheet/soda lime glass back sheet; 3) Composition 106 front sheet/polymer back sheet; 4) Composition 106 front sheet/soda lime glass back sheet; and 5) Composition 106 front sheet/Composition 106 back sheet. Damp heat measurements are done at no bias (FIG. 12A) and −1000V bias (FIG. 12B) for up to 3000 hours. As can be seen in FIG. 13, the soda lime glass front and backed sheets quickly succumb to the harsh testing conditions. The polymer backed modules do better, but still showed significant degradation at 2000+ hours. Remarkably, the embodied PV modules, with the low sodium glass compositions show little to no degradation all the way out to 3000 hours.

TABLE 5 shows the percent change in power, fill factor, FF, and series resistance, $R_s$, for embodied PV modules comprising Composition 106 and using Construction 1 components:

TABLE 5

| Stress | (% change from 0 Stress Time) | | |
|---|---|---|---|
| time (hr) | Power | FF | Rs |
| 0 | 0 | 0 | 0 |
| 500 | −1.1 | −0.8 | 2.8 |
| 1000 | −0.8 | −1.0 | 3.6 |
| 1500 | −1.3 | −1.7 | 5.5 |
| 2000 | −1.6 | −1.8 | 5.6 |
| 2500 | 0.6 | 0.1 | 0.8 |

Figure 14A:
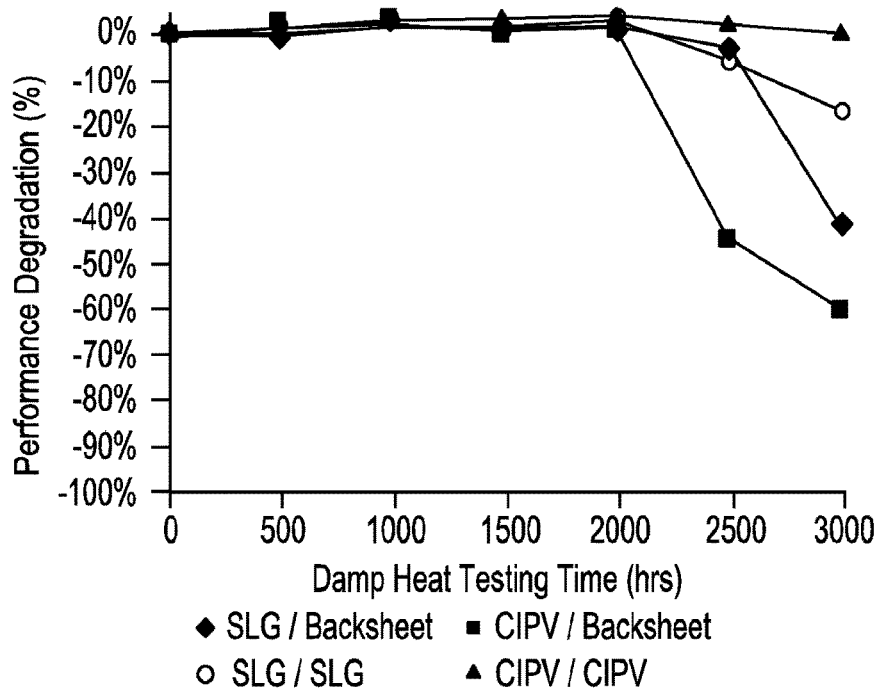
FIGS. 14A and 14B show performance degradation of certain photovoltaic modules (referred to as "Construction 2") with a variety of cover materials. The figures show the photovoltaic modules under no bias (FIG. 14A) and −1000 V bias (FIG. 14B).
Figure 14B:
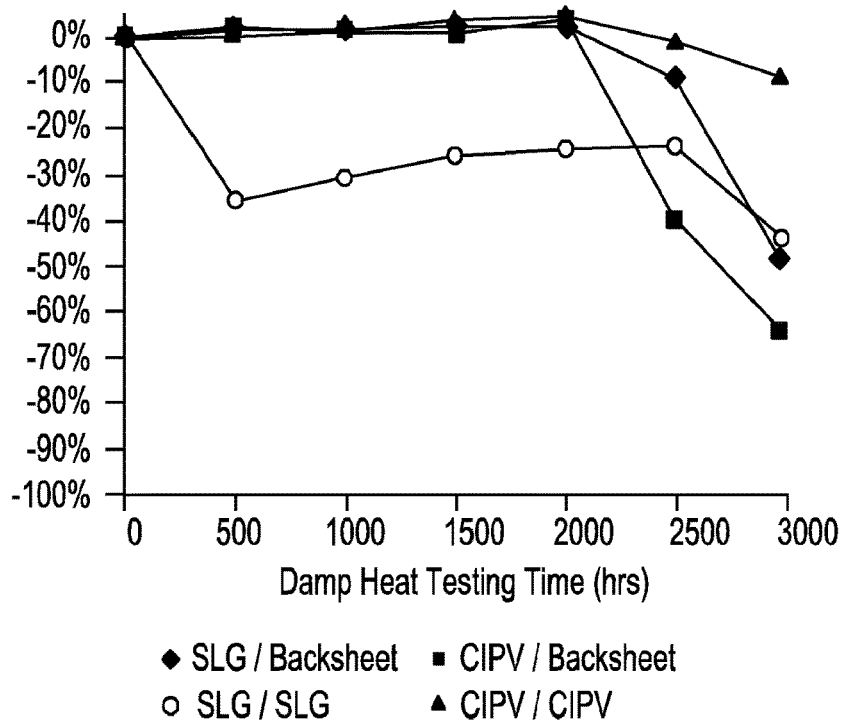
Figure 15:
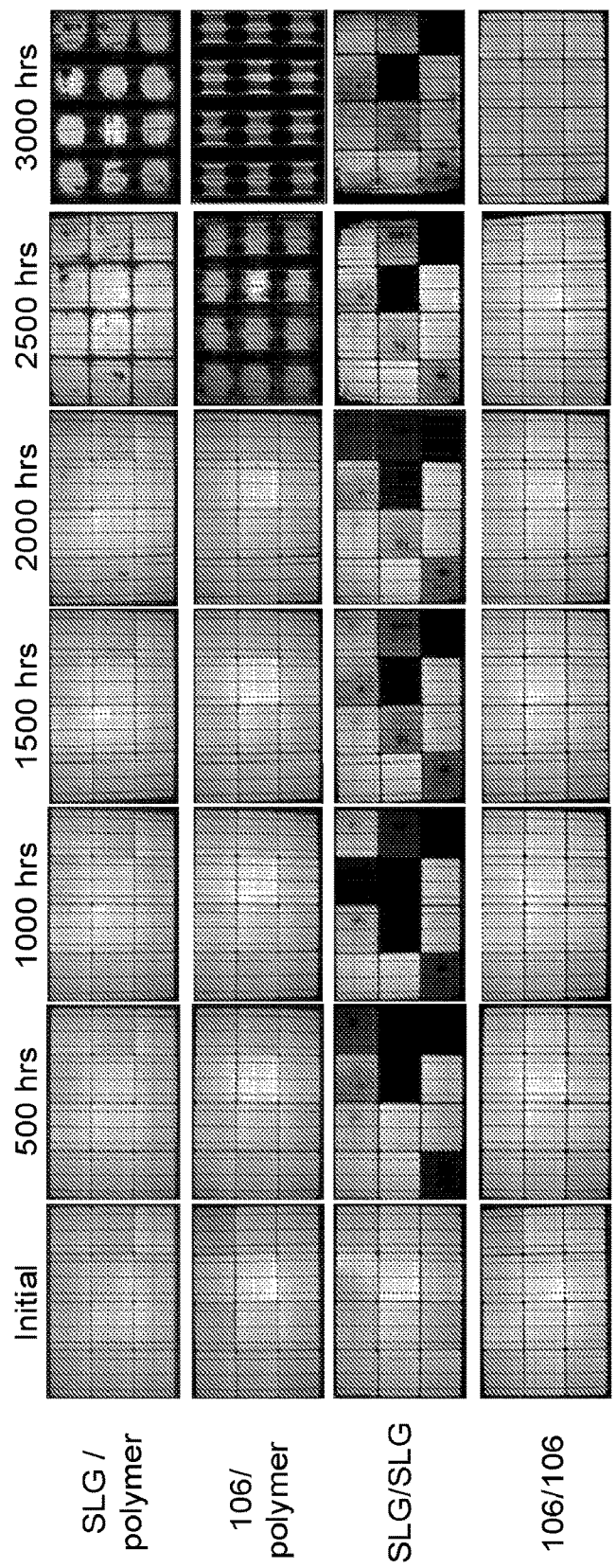
FIG. 15 provides a series of images pictorially showing photovoltaic module performance graphed in FIG. 14B.

Components from Construction list 2 are used to make four different PV modules—1) soda lime glass front sheet/polymer back sheet; 2) soda lime glass front sheet/soda lime glass back sheet; 3) Composition 106 front sheet/polymer back sheet; and 4) Composition 106 front sheet/Composition 106 back sheet. Damp heat measurements are done at no bias (FIG. 14A) and −1000 V bias (FIG. 14B) for up to 3000 hours. The results of these tests are similar to those with Construction 1 components. Again, as can be seen in FIG. 15, the soda lime glass front and backed sheets show significant degradation under the harsh testing conditions. The polymer backed modules do better, but still showed significant degradation at 2500+ hours. Remarkably, the embodied PV modules, with the low sodium glass compositions show little to no degradation all the way out to 3000 hours.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, the claimed invention and disclosure are not limited to these aspects.

The invention claimed is:

1. A photovoltaic module comprising
a first protective layer comprising a sodium-free and alkali-free glass sheet,
a second protective layer comprising a sodium-free and alkali-free glass sheet,
at least one crystalline silicon photovoltaic structure between the first and second outer protective layers, and
an additional glass layer, wherein:
the composition of the first protective layer comprises $SiO_2$, $Al_2O_3$, and $B_2O_3$, and is sodium-free and alkali-free;
the composition of the second protective layer comprises $SiO_2$, $Al_2O_3$, and $B_2O_3$, and is sodium-free and alkali-free;
the additional glass layer comprises a Na-based glass and is characterized by a thickness and rigidity exceeding that of the first and second protective layers; and
the additional glass layer is separated from the photovoltaic structure by a selected one of the first and second protective layers; and
the photovoltaic module defines a photovoltaic structure-free zone between the additional glass layer and the selected protective layer.

2. The module of claim 1, wherein the selected protective layer forms a sodium migration barrier layer between the additional glass layer and the photovoltaic structure.

3. The module of claim 1, wherein:
the photovoltaic structure comprises an encapsulant sheet spacing the first and second protective layers by 0.25 mm, or less; and
the first and second protective layers exhibit sufficient flexibility for self-weighted, substantially failure-free bending at a bend radius of less than approximately 100 cm.

4. The module of claim 1, wherein:
the photovoltaic structure comprises an encapsulant sheet spacing the first and second protective layers by 0.25 mm, or less; and
the first and second protective layers exhibit sufficient flexibility to conform to deviations in flatness between the first and second protective layers.

5. The module of claim 1, wherein the additional glass layer is secured directly to the selected protective layer.

6. The module of claim 1, wherein the first and second protective layers are less than approximately 100 µm in thickness across a substantial entirety of the photovoltaic module.

7. The module of claim 1, wherein:
the first and second protective layers are less than approximately 100 µm in thickness across a substantial entirety of the photovoltaic module; and
the additional glass layer has a thickness of greater than 1.5 mm.

8. The module of claim 1, wherein the photovoltaic module exhibits at least one of:
(i) an insulation resistance value of greater than approximately 4001 MΩ·m² tested under the IEC 61215 measurement guidelines for wet leakage current;
(ii) less than 10% output power degradation under the IEC 61215 damp heat standard at approximately 2500 hours of 85° C./85% humidity and −1 kV bias stressing;
(iii) less than 10% fill factor degradation under the IEC 61215 damp heat standard at approximately 2500 hours of 85° C./85% humidity and −1 kV bias stressing; and
(iv) less than 10% series resistance increase under the IEC 61215 damp heat standard at approximately 2500 hours of 85° C./85% humidity and −1 kV bias stressing.

9. A photovoltaic module comprising
a first protective layer comprising a sodium-free and alkali-free glass sheet,
a second protective layer comprising a sodium-free and alkali-free glass sheet,
at least one crystalline silicon photovoltaic structure between the first and second outer protective layers,
an encapsulant sheet spacing the first and second protective layers by 0.25 mm, or less and
an additional glass layer, wherein:
the composition of the first protective layer comprises $SiO_2$, $Al_2O_3$, and $B_2O_3$, and is sodium-free and alkali-free;
the composition of the second protective layer comprises $SiO_2$, $Al_2O_3$, and $B_2O_3$, and is sodium-free and alkali-free;
the first and second protective layers exhibit sufficient flexibility for self-weighted, substantially failure-free bending at a bend radius of less than approximately 100 cm to conform to deviations in flatness between the first and second protective layers;
the additional glass layer comprises a Na-based glass and is characterized by a rigidity exceeding that of the first and second protective layers;
the first and second protective layers are less than approximately 100 µm in thickness across a substantial entirety of the photovoltaic module;
the additional glass layer has a thickness of greater than 1.5 mm;
the additional glass layer is separated from the photovoltaic structure by a selected one of the first and second protective layers to form a sodium migration barrier layer between the additional glass layer and the photovoltaic structure; and
the photovoltaic module defines a photovoltaic structure-free zone between the additional glass layer and the selected protective layer.

10. The module of claim 1, wherein the module exhibits an insulation resistance value of greater than 4000 MΩ·m² tested under the IEC 61215 measurement guidelines for wet leakage current.

11. The module of claim 1, further comprising an edge seal between the first and second outer protective layers to form a substantially sealed cavity comprising the photovoltaic structure.

12. The module of claim 1, wherein the first and second protective layers have a B—OH value of from 0.2 mm⁻¹ to 0.9 mm⁻¹.

13. The module of claim 1, wherein at least one of the first and second protective layers has an average surface roughness ($R_a$) of ≤20 Å.

14. The module of claim 1, wherein at least one of the first and second protective layers has a thickness below 3 mm and a curvature deformation, W, less than 0.5 micrometer/cm², as described by the equation $W=D/L^2$, wherein D is the maximum curvature of glass sheet in µm and L is the diagonal length of glass sheet in cm.

15. The module of claim 1, wherein at least one of the first and second protective layers has a thickness of 1.8 mm or less.

16. The module of claim 1, wherein at least one of the first and second protective layers has a thickness of 0.5 mm or less.

17. The module of claim 16, wherein the first and second protective layers are capable of being processed under roll-to-roll conditions.

18. The module of claim 1, wherein the additional glass layer has a thickness of greater than 1.5 mm.

19. The module of claim 1, wherein the module exhibits less than 5% output power degradation under the IEC 61215 damp heat standard at approximately 2500 hours of 85° C./85% humidity and −1 kV bias stressing.

20. The module of claim 1, wherein the module exhibits less than 5% fill factor degradation under the IEC 61215 damp heat standard at approximately 2500 hours of 85° C./85% humidity and −1 kV bias stressing.

21. The module of claim 1, wherein the module exhibits less than 5% series resistance increase under exposure to approximately 2500 hours of 85° C./85% humidity per the IEC 61215 damp heat standard and −1 kV bias stressing.

22. The module of claim 1, wherein the first and second protective layers have an average surface roughness ($R_a$) of ≤20 Å.

23. The module of claim 1, wherein the first and second protective layers have respective thicknesses below 3 mm and respective curvature deformations, W, less than 0.5 micrometer/cm², as described by the equation $W=D/L^2$, wherein D is the maximum curvature of glass sheet in μm and L is the diagonal length of glass sheet in cm.

24. The module of claim 1, wherein the first and second protective layers have respective thicknesses of 1.8 mm or less.

25. The module of claim 1, wherein the first and second protective layers have respective thicknesses of 0.5 mm or less.

26. The module of claim 25, wherein the first and second protective layers are capable of being processed under roll-to-roll conditions.

* * * * *

UNITED STATES PATENT AND TRADEMARK OFFICE
CERTIFICATE OF CORRECTION

PATENT NO. : 10,347,782 B2
APPLICATION NO. : 14/236824
DATED : July 9, 2019
INVENTOR(S) : Bruce Gardiner Aitken et al.

Page 1 of 1

It is certified that error appears in the above-identified patent and that said Letters Patent is hereby corrected as shown below:

On the Title Page

In Column 2, item (56), Other Publication, Line 1, delete "Rupublic" and insert -- Republic --, therefor.

On the page 2, in Column 2, item (56), Other Publication, Line 17, delete "depolyed" and insert -- deployed --, therefor.

On the page 2, in Column 2, item (56), Other Publication, Line 20, delete "Photoboltaic" and insert -- Photovoltaic --, therefor.

Signed and Sealed this
Thirty-first Day of December, 2019

Andrei Iancu
*Director of the United States Patent and Trademark Office*